United States Patent [19]
Nishi et al.

[11] Patent Number: 5,464,715
[45] Date of Patent: Nov. 7, 1995

[54] METHOD OF DRIVING MASK STAGE AND METHOD OF MASK ALIGNMENT

[75] Inventors: Kenji Nishi, Yokohama; Seiro Murakami, Chiba, both of Japan

[73] Assignee: Nikon Corporation, Tokyo, Japan

[21] Appl. No.: 217,841

[22] Filed: Mar. 25, 1994

[30] Foreign Application Priority Data

Apr. 2, 1993 [JP] Japan .................................. 5-076045
Apr. 13, 1993 [JP] Japan .................................. 5-086066

[51] Int. Cl.$^6$ .................................................. G03F 9/00
[52] U.S. Cl. .................. 430/22; 430/5; 356/399; 356/400; 356/401
[58] Field of Search ................... 430/22, 5; 356/399, 356/400, 401

[56] References Cited

U.S. PATENT DOCUMENTS 4,710,029 12/1987 Katoh ........................ 356/401
4,716,299 12/1987 Tanaka et al. ........................ 250/571
5,151,749 9/1992 Tanimoto et al. ..................... 356/401

Primary Examiner—S. Rosasco
Attorney, Agent, or Firm—Shapiro and Shapiro

[57] ABSTRACT

In a scanning-type projection exposure system, curvature of a movable mirror that is used to measure mask stage coordinate positions is determined while the mask stage is moved in the scanning direction, by measuring coordinate positions, perpendicular to the scan direction, of the mask stage and of a mask mark elongated in the scan direction. The results of the measurements are used for correcting or compensating positional deviation during scanning. Rotational deviation of a mask pattern area is determined and is corrected or compensated. Also, a mask is aligned with respect to a coordinate system of the mask stage as pre-processing for exposure, using a mask alignment mark having two crossing linear patterns and determining a coordinate position of the crossing point by moving the mask relative to an observation area.

9 Claims, 15 Drawing Sheets

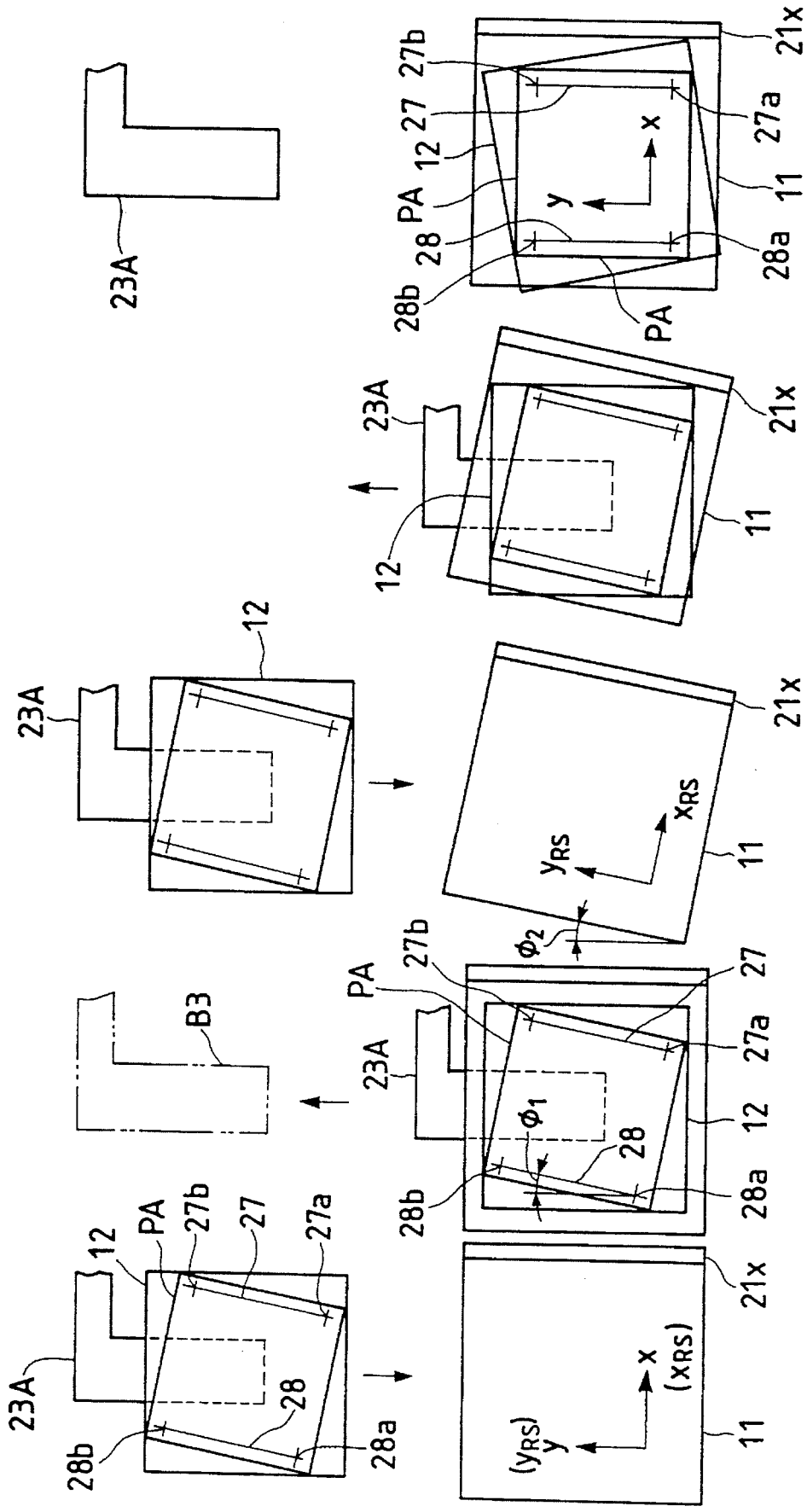

1

METHOD OF DRIVING MASK STAGE AND METHOD OF MASK ALIGNMENT

BACKGROUND OF THE INVENTION

1. Field of the Invention

The present invention relates to a method of driving a mask stage and a method of mask alignment. More particularly, the present invention relates to a method of driving a stage, which is suitably applied to a case wherein a reticle-side stage is driven in a scan direction in a slit-scan exposure type projection exposure apparatus, and a method of mask alignment in the projection exposure apparatus.

2. Related Background Art

When a semiconductor element, a liquid crystal display element, a thin film magnetic head, or the like is manufactured in a photolithography process, a projection exposure apparatus for transferring a pattern on a photomask or a reticle (to be generally referred to as a "reticle" hereinafter) onto a substrate (a wafer, glass plate, or the like) coated with a photosensitive material is used.

As a conventional projection exposure apparatus, a step-and-repeat type reduction projection exposure apparatus (stepper) for sequentially exposing a pattern image on a reticle onto each of shot areas by sequentially moving the shot areas of a wafer into an exposure field of a projection optical system is popularly used.

In recent years, since patterns on semiconductor devices or the like tend to be miniaturized, it is required to increase the resolution of a projection optical system. For this reason, in order to increase the resolution, a technique for decreasing the wavelength of exposure light, a technique for increasing the numerical aperture of the projection optical system, and the like have been examined. However, with either technique, it becomes difficult to maintain high accuracy of imaging performance (a distortion, curvature of field, and the like) on the entire exposure field when an exposure field as large as that in the prior art is to be assured. For this reason, an apparatus which is currently reconsidered its use is a so-called slit-scan exposure type projection exposure apparatus.

In the slit-scan exposure type projection exposure apparatus, a pattern on a reticle is exposed onto a wafer, wherein the reticle and wafer are being synchronously scanned relative to a rectangular or arcuated illumination area (to be referred to as a "slit-like illumination area" hereinafter).

Therefore, when a pattern with the same area as that in the stepper system is to be exposed onto a wafer, the exposure field of the projection optical system in the slit-scan exposure system can be set to be smaller than that in the stepper system. As a result, accuracy of imaging performance in the exposure field may be improved.

The mainstream of the conventional reticle size is 6", and the mainstream of the projection magnification of the projection optical system is ×⅕. However, as the area of the circuit pattern of, e.g., a semiconductor element increases, the 6" reticle cannot serve its purpose at the ×⅕ magnification. For this reason, a projection exposure apparatus in which the projection magnification of the projection optical system is changed to, e.g., ×¼ must be designed. In order to cope with such an increase in area of a pattern to be transferred, the slit-scan exposure system is advantageous.

In a projection exposure apparatus of this type (stepper), a reticle must be aligned in advance on a reticle stage. For this purpose, a reticle alignment device is arranged on a reticle mark on the reticle. Such a reticle alignment device is disclosed in U.S. Pat. No. 4,710,029. In an alignment system disclosed in U.S. Pat No. 4,710,029, light reflected by an alignment mark on a reticle is incident on a sensor via a vibration mirror and a slit. When the output from the sensor is synchronously detected by a driving signal of the vibration mirror, the position of the alignment mark relative to a slit is detected. The position of the alignment mark is detected based on a signal from the sensor in the alignment system, and the reticle is moved by a servo system, so that the alignment mark accurately coincides with the slit. As a result, alignment of the reticle with respect to the apparatus main body is executed.

SUMMARY OF THE INVENTION

In such a slit-scan exposure system, when the moving path of the reticle stage for driving a reticle is curved with respect to a desired path (for example, the moving path has a predetermined curvature with respect to a desired linear path), each shot area on a wafer undesirably has an intra-shot distortion according to the curve (curvature) of the moving path of the reticle stage. Furthermore, when the characteristics of an intra-shot distortion vary from one exposure apparatus to another, such a variation results in a matching error between different layers on the wafer. When the reticle stage is controlled by a method of measuring the position of the reticle stage by interfering light components reflected by a stationary mirror and a movable mirror provided to the reticle stage using an optical interferometer, such a curve of the path of the reticle stage is caused by a curve of the movable mirror.

The present invention has been made in consideration of the above situation, and has as its object to provide a method of driving a stage, which can prevent generation of an intra-shot distortion even when a movable mirror provided to a stage at the side of a reticle (mask) has a curve in a slit-scan exposure type exposure apparatus.

In order to achieve the above object, according to the first invention, there is provided a method of driving a mask stage using the mask stage which mounts a mask formed with a predetermined pattern and is movable in a predetermined scan direction, a movable mirror which is arranged on the mask stage and has a reflection surface substantially parallel to the scan direction, measurement means for measuring a coordinate position, in a direction perpendicular to the scan direction, of the mask stage by radiating a measurement beam onto the movable mirror, a substrate stage which mounts a photosensitive substrate and is movable in a direction substantially parallel to the scan direction, an illumination system for illuminating a predetermined area on the mask with illumination light, a projection optical system for projecting the pattern on the mask onto the photosensitive substrate, and an exposure device for sequentially exposing the pattern on the mask onto the photosensitive substrate while synchronously scanning the mask stage and the substrate stage in the scan direction with respect to an optical axis of the projection optical system, comprising:

the first step of placing the mask on the mask stage;

the second step of calculating a curved amount of the movable mirror by measuring the coordinate position, in the direction perpendicular to the scan direction, of the mask stage by the measurement means while scanning the mask stage in the scan direction; and the third step of moving the mask stage in the direction perpendicular to the scan direction to correct the curved amount of the movable mirror calculated in the second step when the mask stage is scanned in the scan direction with respect to the optical axis.

According to the second invention, there is provided a method of driving a mask stage using a mask guide which is formed with a guide portion extending in a predetermined scan direction, the mask stage which is mounted on the mask Guide to be movable in the scan direction, and mounts a mask formed with a predetermined pattern, a movable mirror which is attached to the mask stage, and has a reflection surface substantially parallel to the scan direction, measurement means for measuring a coordinate position, in a direction perpendicular to the scan direction, of the mask stage by radiating a measurement beam onto the movable mirror, a substrate stage which is movable in a direction substantially parallel to the scan direction and mounts a photosensitive substrate, an illumination system for illuminating a predetermined area on the mask with illumination light, a projection optical system for projecting the pattern on the mask onto the photosensitive substrate, and an exposure device for sequentially exposing the pattern on the mask onto the photosensitive substrate while synchronously scanning the mask stage and the substrate stage in the scan direction with respect to an optical axis of the projection optical system, comprising the steps of:

calculating a curved amount of the movable mirror by measuring the coordinate position, in the direction perpendicular to the scan direction, of the mask stage by the measurement means by scanning the mask stage in the scan direction with reference to the mask guide; and moving the mask stage in the direction perpendicular to the scan direction so as to correct the curved amount of the movable mirror when a transfer mask is scanned via the mask stage in the scan direction with respect to the predetermined shaped illumination area.

According to the first invention, since the curved amount of the movable mirror is measured with reference to the measurement mark provided to the mask, and the measured curved amount is corrected in exposure, even when the movable mirror provided to the mask stage on the side of the mask has a curve, generation of an intra-shot distortion at the substrate side can be prevented.

According to the second invention, since the curved amount of the movable mirror is measured with reference to the mask guide, when the straightness of the mask guide is good, the curved amount of the movable mirror can be quickly and easily measured, and the measured curved amount can be corrected in exposure.

In the slit-scan exposure type projection exposure apparatus as well, when a reticle is exchanged with another one, the new reticle must be aligned. However, in the slit-scan exposure system for driving a reticle in a predetermined direction with high accuracy during exposure, a reticle interferometer for monitoring the position of the reticle with high accuracy must be mounted. For this reason, it is difficult to assure larger driving strokes of the reticle in the X and Y directions and the rotational direction than those in a conventional stepper type projection exposure apparatus upon alignment of a reticle. Therefore, it is difficult to directly apply an alignment method used in the conventional stepper to the slit-scan exposure type projection exposure apparatus.

In general, the electron beam drawing error of a reticle mark with respect to the outer shape of a reticle is about ±0.5 mm to ±1 mm. In this case, when the reticle is aligned on the reticle stage with reference to its outer shape, if a pattern drawing area is inclined at a maximum inclination angle with respect to the outer shape of the reticle, the lateral shift amount of a laser beam from a reticle interferometer exceeds an allowable value of the lateral shift amount in a receiver of the interferometer. Therefore, it is difficult to completely correct the drawing error of a reticle in the conventional alignment method without causing a measurement error of the reticle interferometer.

Furthermore, an apparatus which mounts such a reticle interferometer can align a reticle at an arbitrary position with high accuracy by open-loop control. For this reason, an alignment method which can detect the position of a reticle mark at high speed by open-loop control must be developed in place of conventional closed-loop control (servo control) based on synchronous detection.

The present invention has been made in consideration of the above situation, and has as its object to provide an alignment method which can align a reticle (mark) at high speed with high accuracy in a slit-scan exposure type projection exposure apparatus.

In order to achieve the above object, according to the third invention, there is provided a method of aligning a mask with respect to a coordinate system on the side of a mask stage as pre-processing for exposing a pattern on the mask onto a photosensitive substrate using the mask stage which mounts the mask formed with a predetermined pattern and is movable in a predetermined scan direction, a substrate stage which mounts the photosensitive substrate and is movable in a direction substantially parallel to the scan direction, an illumination system for illuminating a predetermined illumination area on the mask with illumination light, a projection optical system for projecting the pattern on the mask onto the photosensitive substrate, observation means for observing a mark on the mask, and an exposure device for sequentially exposing the pattern on the mask onto the photosensitive substrate while synchronously scanning the mask stage and the substrate stage in the scan direction with respect to an optical axis of the projection optical system, comprising:

the first step of placing, as the mask, a mask formed with a first alignment mark having two linear patterns which cross each other, on the mask stage;

the second step of moving the two linear patterns in a direction to cross each other on the first alignment mark on the mask relative to an observation area of the observation means;

the third step of calculating a coordinate position, in the coordinate system on the side of the mask stage, of a crossing point of the two linear patterns of the first alignment mark by processing image data obtained by the observation means; and the fourth step of aligning the mask to the coordinate system on the side of the mask stage on the basis of the coordinate position of the crossing point of the two linear patterns of the first alignment mark.

According to the fourth invention, there is provided a method of aligning a mask with respect to a coordinate system on the side of a mask stage as pre-processing for exposing a pattern on the mask onto a photosensitive substrate using the mask stage which mounts the mask formed with a predetermined pattern and is movable in a predetermined scan direction, a substrate stage which mounts the photosensitive substrate and is movable in a direction substantially parallel to the scan direction, an illumination system for illuminating a predetermined illumination area on the mask with illumination light, a projection optical system for projecting the pattern on the mask onto the photosensitive substrate, and an exposure device for sequentially exposing the pattern on the mask onto the photosensitive substrate while synchronously scanning the mask stage and the substrate stage in the scan direction with respect to an optical axis of the projection optical system, comprising:

the first step of placing, as the mask, a mask formed with an alignment mark, on the mask stage; and the second step of calculating a rotational angle of the mask with respect to the coordinate system on the side of the mask stage by calculating a coordinate position of the alignment mark, and when the rotational angle calculated in the second step exceeds a predetermined allowable value, the method further comprising:

the third step of unloading the mask from the mask stage;

the fourth step of rotating the mask stage by a predetermined rotational angle in a direction of the rotational angle calculated in the second step; and the fifth stage of placing the mask on the mask stage again, and rotating the mask stage in a direction opposite to the rotational direction in the fourth step.

According to the fifth invention, there is provided a method of aligning a mask with respect to a coordinate system on the side of a mask stage as pre-processing for exposing a pattern on the mask onto a photosensitive substrate using the mask stage which mounts the mask formed with a predetermined pattern and is movable in a predetermined scan direction, a substrate stage which mounts the photosensitive substrate and is movable in a direction substantially parallel to the scan direction, an illumination system for illuminating a predetermined illumination area on the mask with illumination light, a projection optical system for projecting the pattern on the mask onto the photosensitive substrate, and an exposure device for sequentially exposing the pattern on the mask onto the photosensitive substrate while synchronously scanning the mask stage and the substrate stage in the scan direction with respect to an optical axis of the projection optical system, comprising:

the first step of placing, as the mask, a mask formed with an alignment mark, on the mask stage; and the second step of calculating a rotational angle of the mask with respect to the coordinate system on the side of the mask stage by calculating a coordinate position of the alignment mark, and when the rotational angle calculated in the second step exceeds a predetermined allowable value, the method further comprising:

the third step of rotating the mask stage in a direction opposite to the rotational angle calculated in the second step;

the fourth step of unloading the mask from the mask stage; and the fifth stage of rotating the mask stage in a direction opposite to the rotational direction in the third step, and placing the mask on the mask stage again.

According to the third invention, when the mask stage is driven with respect to the observation area of the observation means so as to obliquely scan the mask, the coordinate position of the crossing point of the two linear patterns of the alignment mark on the mask can be measured by the open-loop control. Therefore, mask alignment can be realized at high speed with high accuracy.

According to the fourth and fifth inventions, when a mask is re-placed on the mask stage upon occurrence of a rotation error of the mask which poses a problem when a slit-scan exposure type mask stage is used, mask alignment can be realized at high speed with high accuracy. Also, strokes of the reticle stage upon alignment need not be increased, and length measuring means need not have any correction mechanism.

BRIEF DESCRIPTION OF THE DRAWINGS

FIGS. 15A, 15B, 15C, 15D, and 15E are views for explaining an operation for re-placing a reticle 12 by rotating a reticle fine driving stage 11 when a pattern drawing area PA on the reticle 12 is inclined with respect to a reticle coordinate system.

DESCRIPTION OF THE PREFERRED EMBODIMENTS

An embodiment of a projection exposure method according to the present invention will be described below with reference to the accompanying drawings. In this embodiment, the present invention is applied to a case wherein a pattern on a reticle is exposed onto a wafer using a slit-scan exposure type projection exposure apparatus.

Figure 1:
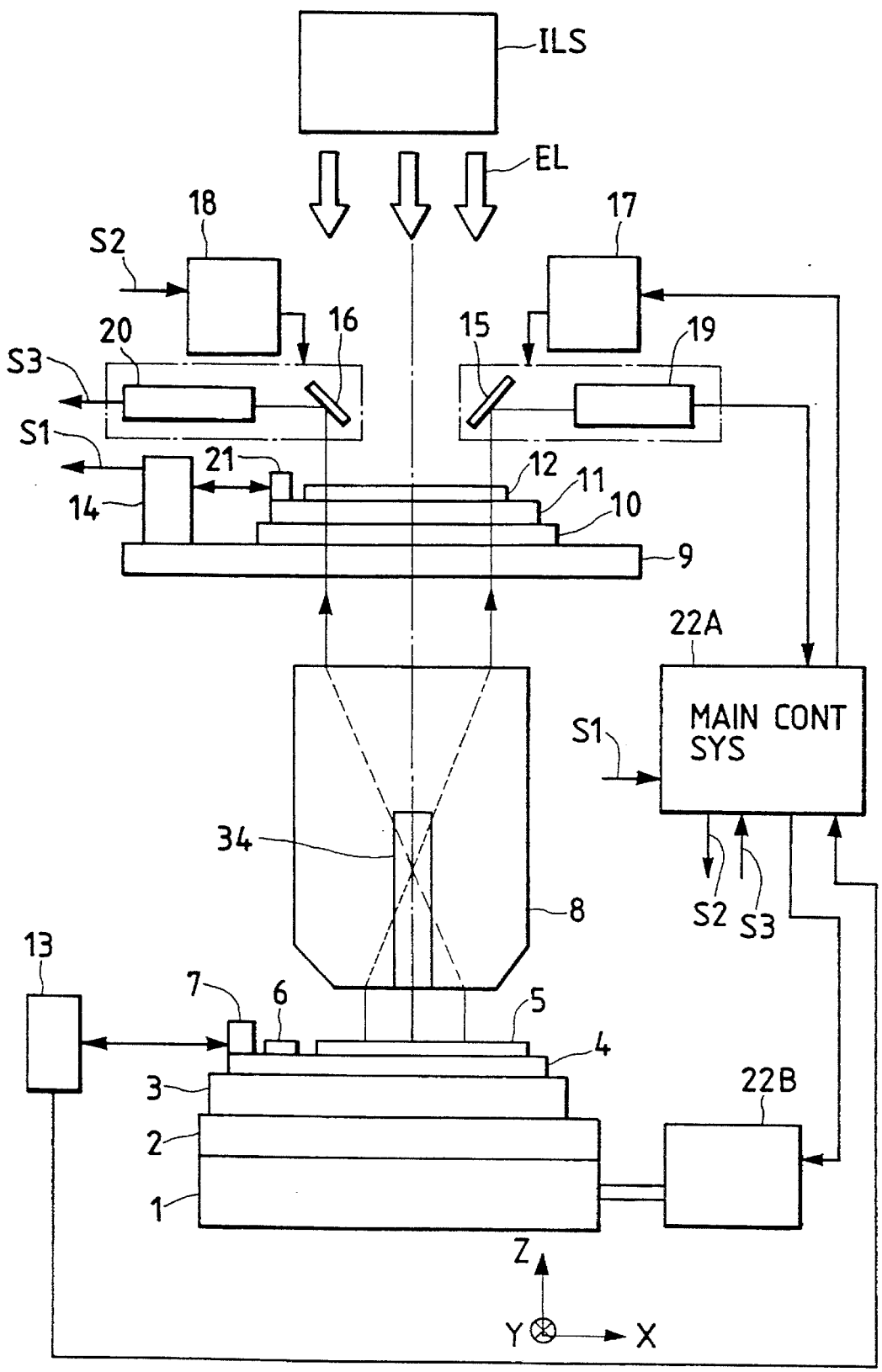
FIG. 1 is a schematic view showing a projection exposure apparatus according to an embodiment of the present invention.

FIG. 1 shows a projection exposure apparatus of this embodiment. Referring to FIG. 1, a pattern on a reticle 12 is illuminated with exposure light EL from an illumination optical system ILS. The illumination optical system ILS forms a rectangular illumination area (to be referred to as a "slit-like illumination area" hereinafter) by the exposure light EL on the reticle 12. The reticle pattern and the surface of a wafer 5 are optically conjugate with each other with respect to a projection optical system 8. A reticle pattern image in the slit-like illumination area is projected and exposed onto the wafer 5 via the projection optical system 8.

In this case, the wafer 5 is scanned at a constant velocity $V/\beta$ ($1/\beta$ is the reduction factor of the projection optical system 8) in the backward direction with respect to the plane of the drawing of FIG. 1 (in the backward direction with respect to the plane of the drawing in the Y-axis) in synchronism with the reticle 12 which is scanned relative to the slit-like illumination area of the exposure light EL at a constant velocity V in the forward direction with respect to the plane of the drawing of FIG. 1 (in the forward direction with respect to the plane of the drawing in the Y-axis).

Driving systems of the reticle 12 and the wafer 5 will be described below.

A reticle Y-driving stage 10, which is movable in the Y-axis direction (the direction perpendicular to the plane of the drawing of FIG. 1) is mounted on a reticle support table 9. A reticle fine driving stage 11 is mounted on the reticle Y-driving stage 10. The reticle 12 is held by, e.g., a vacuum chuck on the reticle fine driving stage 11. The reticle fine driving stage 11 is finely movable in the X direction parallel to the plane of the drawing of FIG. 1 in a plane perpendicular to the optical axis of the projection optical system 8, the Y direction perpendicular to the plane of the drawing, and the rotational direction (θ direction) in the X-Y plane. The reticle fine driving stage 11 performs position control of the reticle 12 in the X, Y, and θ directions by a very small amount with high accuracy.

A movable mirror 21 is arranged on the reticle fine driving stage 11.

An interferometer 14 arranged on the reticle support table 9 radiates a laser beam onto the movable mirror 21, and always monitors the positions, in the X, Y, and θ directions, of the reticle fine driving stage 11 on the basis of light reflected by the movable mirror.

Position information S1 obtained by the interferometer 14 is supplied to a main control system 22A.

On the other hand, a wafer Y-axis driving stage 2, which is movable in the Y-axis direction, is mounted on a wafer support table 1. A wafer X-axis driving stage 3, which is movable in the X-axis direction, is mounted on the wafer Y-axis driving stage 2. A Zθ-axis driving stage 4 is arranged on the wafer X-axis driving stage 3. The wafer 5 is held on the ZS-axis driving stage 4 by vacuum chucking.

A movable mirror 7 is also fixed on the Zθ-axis driving stage 4, and the positions, in the X, Y, and θ directions, of the Zθ-axis driving stage 4 are monitored by an interferometer 13 which is arranged outside the apparatus. Position information obtained by the interferometer 13 is also supplied to the main control system 22A. The main control system 22A controls the alignment operations of the wafer Y-axis driving stage 2 to the Zθ-axis driving stage 4 via a wafer driving device 22B and the like, and also controls the operations of the entire apparatus.

As will be described later, a reference or fiducial mark plate 6 is fixed on the Zθ-axis driving stage 4 so as to attain a correspondence between a wafer coordinate system and a reticle coordinate system. The reference mark plate 6 is arranged near the wafer 5. The wafer coordinate system is defined by coordinates measured by the interferometer 13 on the wafer side, and the reticle coordinate system is defined by coordinates measured by the interferometer 14 on the reticle side. Various reference marks are formed on the reference mark plate 6, as will be described later. These reference marks include a luminous reference mark. The luminous reference mark is a reference mark illuminated from the back side with illumination light guided to the Zθ-axis driving stage 4 side.

Reticle alignment microscopes 19 and 20 for simultaneously observing the reference marks on the reference mark plate 6 and marks on the reticle 12 are equipped above the reticle 12 of this embodiment.

In this case, deflection mirrors 15 and 16 for guiding detection light from the reticle 12 to the reticle alignment microscopes 19 and 20 are arranged. The deflection mirrors 15 and 16 are movable in the X direction. When the exposure sequence is started, the deflection mirrors 15 and 16 are respectively retreated from the exposure light EL by mirror driving devices 17 and 18 in accordance with an instruction from the main control system 22A.

Furthermore, an off-axis alignment device 34 for observing alignment marks (wafer marks) on the wafer 5 is arranged on the side surface portion, in the Y direction, of the projection optical system 8.

The mechanism and operation for performing alignment of the reticle 12 and measurement of the curve of the movable mirror (to be described later) will be described below.

Figure 2A:
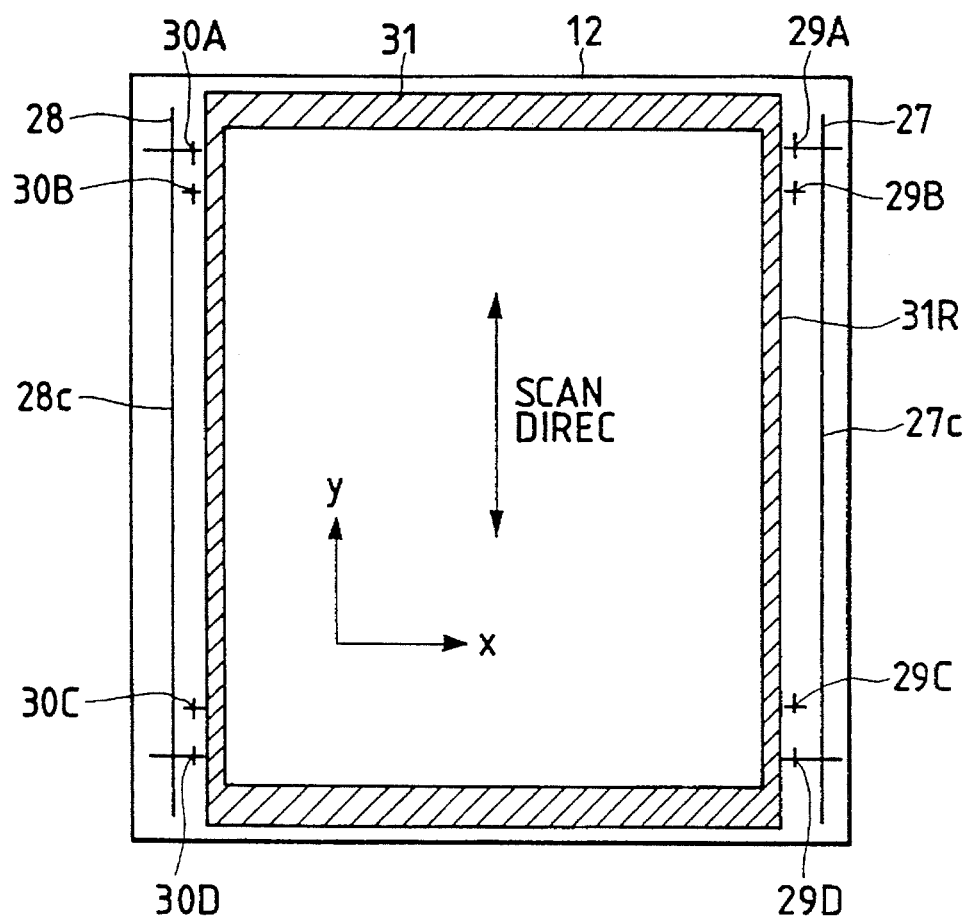
FIG. 2A is a plan view showing the arrangement of a curve measurement mark and an alignment mark on a reticle.
Figure 2B:
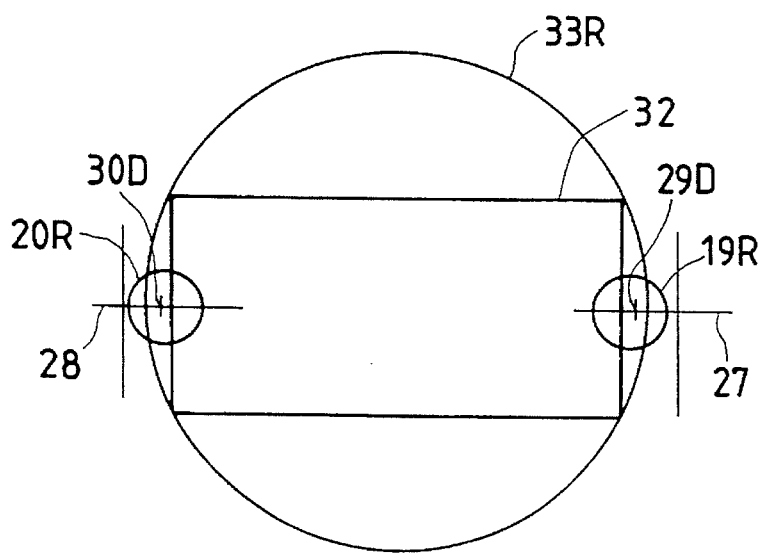
FIG. 2B is a plan view showing the arrangement of the alignment mark and the like on an area conjugate with the effective field of a projection optical system.

FIG. 2A shows the arrangement of alignment marks (reticle marks) and curve measurement marks on the reticle 12, and FIG. 2B shows a slit-like illumination area 32 and the like in an area 33R conjugate with the effective exposure field of the projection optical system on the reticle. Assume that the scan direction is defined as a y direction, and a direction perpendicular to the y direction is defined as an x direction. Referring to FIG. 2A, a light-shielding portion 31 is formed around a pattern area of the central portion on the reticle 12. Marks formed outside the light-shielding portion 31 are classified into curve measurement marks 27 and 28, and fine alignment marks 29A, 29B, 29C, 29D, 30A, 30B, 30C, and 30D. The curve measurement mark 27 on the right side is defined by a linear pattern 27c elongated along the y direction as the scan direction, and cross patterns formed at the two end portions of the linear pattern. The curve measurement mark 28 on the left side is defined to have a linear pattern 28c symmetrical with that of the curve measurement mark 27 on the right side.

As will be described later, the curve measurement marks 27 and 28 of this embodiment can also be used as alignment marks upon execution of coarse alignment (rough alignment) of the reticle 12, i.e., as rough search alignment marks.

Figure 2C:
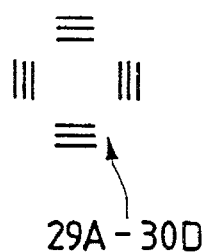
FIG. 2C is an enlarged view showing fine alignment marks 29A to 30D.

The fine alignment marks 29A and 29B are formed between a light-shielding portion 31R on the right side and one cross pattern of the curve measurement mark 27 so as to be close to each other in the y direction, and the fine alignment marks 29C and 29D are formed between the light-shielding portion 31R on the right side and the other cross pattern of the curve measurement mark 27 so as to be close to each other in the y direction. The fine alignment marks 30A to 30D are formed on the left side to be symmetrical with these fine alignment marks 29A to 29D. Each of these fine alignment marks 29A to 29D and 30A to 30D is defined by arranging two sets of three linear patterns at a predetermined interval in the x direction, and arranging two sets of three linear patterns at a predetermined interval in the y direction, as shown in FIG. 2C.

Upon execution of rough alignment of the reticle 12 in this embodiment, the cross patterns of the curve measurement mark 28 on the left side in FIG. 2A are detected by the reticle alignment microscope (to be referred to as an "RA microscope" hereinafter) 20 in FIG. 1. Thereafter, the cross patterns of the curve measurement mark 27 are moved to the observation area of the RA microscope 19, and the position of the alignment mark 27 is similarly measured. In this case, a pattern-free portion of the reference mark plate 6 in FIG. 1 is moved into the exposure field of the projection optical system 8, and is illuminated from its bottom portion. In this manner, the curve measurement marks 27 and 28 are illuminated from their rear surface side with illumination light emerging from the reference mark plate 6.

In the above-mentioned sequence, the positions of the cross patterns of the curve measurement marks 27 and 28 with respect to the RA microscopes 19 and 20 in FIG. 1 can be obtained. More specifically, the positional relationship between the reticle 12 and the reticle coordinate system can be roughly determined in the above-mentioned sequence. A rough correspondence between the RA microscopes 19 and 20 and the wafer coordinate system can be attained by measuring the reference marks on the reference mark plate 6 in FIG. 1 by the RA microscopes 19 and 20. Thus, rough alignment that can avoid an overlap between the fine alignment marks 29A to 29D and 30A to 30D and the reference marks on the reference mark plate 6 is completed. A mark search sequence in the rough alignment will be described later.

The curve measurement sequence for the movable mirror and the fine alignment sequence will be described below. Prior to the description of these sequences, the detailed arrangement of the wafer stage and the reticle stage will be explained.

Figure 3A:
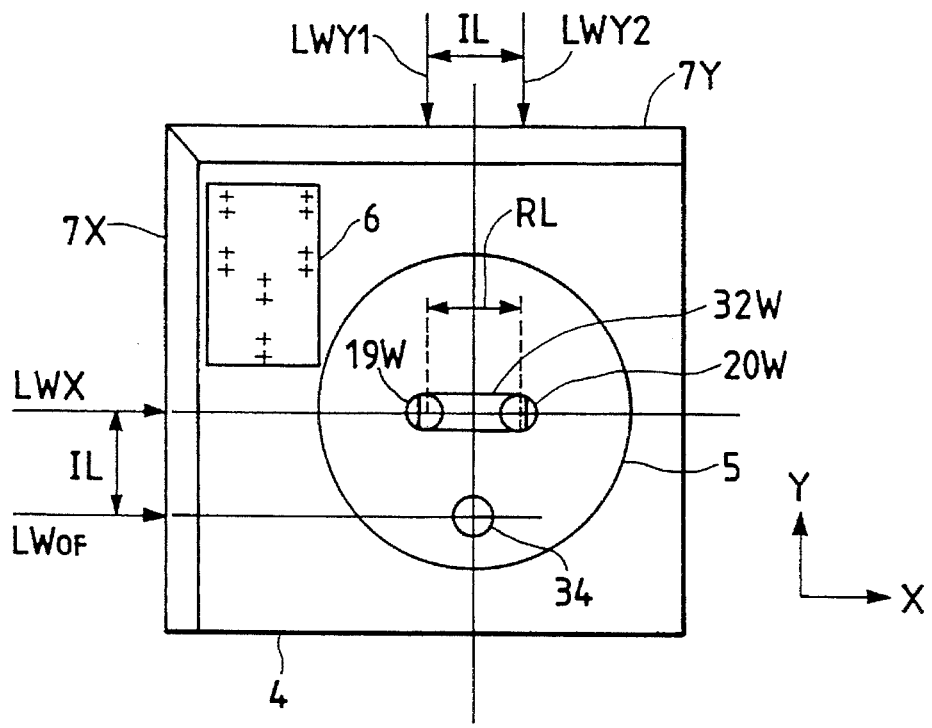
FIG. 3A is a plan view of a stage on the side of a wafer.

FIG. 3A is a plan view of the wafer stage. Referring to FIG. 3A, the wafer 5 and the reference mark plate 6 are arranged on the Zθ-axis driving stage 4. An X-axis movable mirror 7X and a Y-axis movable mirror 7Y are fixed on the Zθ-axis driving stage 4. On the wafer 5, a slit-like illumination area 32W corresponding to the slit-like illumination area 32 in FIG. 2B is illuminated with exposure light, and observation areas 19W and 20W are respectively conjugate with observation areas 19R and 20R in FIG. 2B.

Laser beams LWX and $LW_{of}$ which are separated by an interval IL are radiated onto the movable mirror 7X along optical paths which are parallel to the X-axis and respectively pass the optical axis of the projection optical system and the reference point of the alignment device 34, and two laser beams LWY1 and LWY2 which are separated by the interval IL are radiated onto the movable mirror 7Y along optical paths parallel to the Y axis. In exposure, the coordinate value measured by an interferometer using the laser beam LWX is used as the X-coordinate of the Zθ-axis driving stage 4, and an average value $(Y_1+Y_2)$ of coordinate values $Y_1$ and $Y_2$ measured by interferometers which respectively use the laser beams LWY1 and LWY2 is used as the Y coordinate. The rotational amount of the Zθ-axis driving stage in the rotational direction (θ direction) is measured based on, e.g., the difference between the coordinate values $Y_1$ and $Y_2$. Based on these coordinates, the position, on the X-Y plane, and the rotational angle of the Zθ-axis driving stage 4 are controlled.

In particular, in the Y direction as the scan direction, deterioration of accuracy caused by, e.g., an inclination upon scanning is prevented using the average value of the measurement results from the two interferometers. On the other hand, the position in the X-axis direction when the off-axis alignment device 34 is used is controlled based on the measurement value from a special-purpose interferometer using the laser beam $LW_{of}$ so as to not cause a so-called Abbe's error.

Figure 3B:
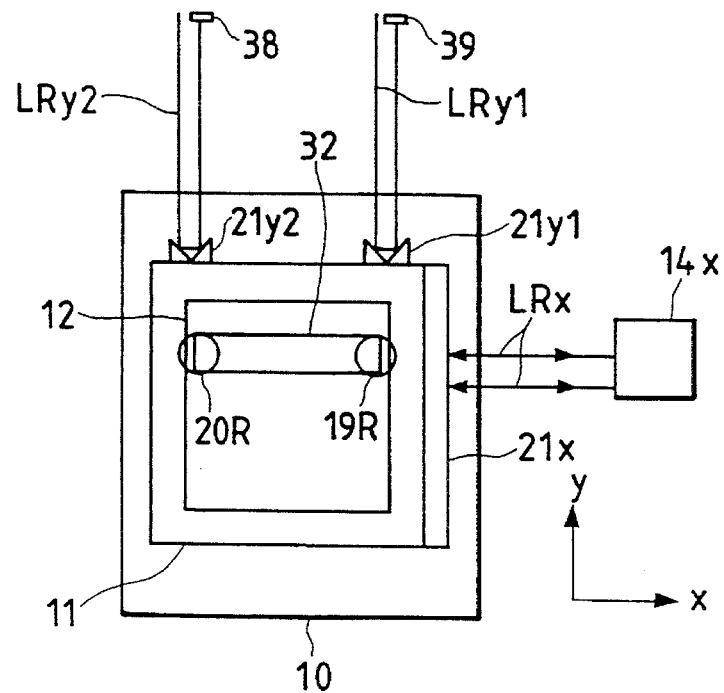
FIG. 3B is a plan view of a stage on the side of a reticle.

FIG. 3B is a plan view of the reticle stage. Referring to FIG. 3B, the reticle fine driving stage 11 is mounted on the reticle Y-driving stage 10, and the reticle 12 is held thereon. An x-axis movable mirror 21x and two y-axis movable mirrors 21y1 and 21y2 are fixed to the reticle fine driving stage 11. Laser beams LRx are radiated onto the movable mirror 21x in a direction parallel to the x-axis, and laser beams LRy1 and LRy2 are radiated onto the movable mirrors 21y1 and 21y2 in a direction parallel to the y-axis.

As in the wafer stage, the coordinate, in the y direction, of the reticle fine driving stage 11 adopts an average value $(y_1+y_2)/2$ of coordinate values $y_1$ and $y_2$ measured by two interferometers using the laser beams LRy1 and LRy2.

Also, a coordinate value measured by an interferometer 14x using the two laser beams LRx in the x direction is used. At this time, an average value of the coordinate values measured using the two laser beams may be used, or the coordinate value may be obtained using either one laser beam LRx. In addition, the rotational amount, in the rotational direction (θ direction), of the reticle fine driving stage is measured based on, e.g., the difference between coordinate values $y_1$ and $Y_2$.

In this case, as the movable mirrors 21y1 and 21y2 for the y direction as the scan direction, corner cube type reflection members are used. The laser beams LRy1 and LRy2 reflected by the movable mirrors 21y1 and 21y2 are respectively reflected by reflection mirrors 39 and 38, and are returned. More specifically, the interferometers for the reticle are double-pass interferometers, thereby preventing positional shifts of the laser beams upon rotation of the reticle fine driving stage 11. Note that the X-axis interferometer 14x may comprise a double-pass interferometer.

As in the wafer stage, the slit-like illumination area 32 and the observation areas 19R and 20R of the RA microscopes 19 and 20 are arranged on the reticle 12. The reticle 12 and the ZS-axis driving stage 4 in FIG. 3A can be observed from only the observation areas 19R and 20R.

The curve of the movable mirror 21x is measured by measuring the relationship between the reticle 12 and the Zθ-axis driving stage 4, as described above, and alignment accuracy in exposure and rotational accuracy of the reticle 12 and wafer 5 can be improved.

Figure 4A:
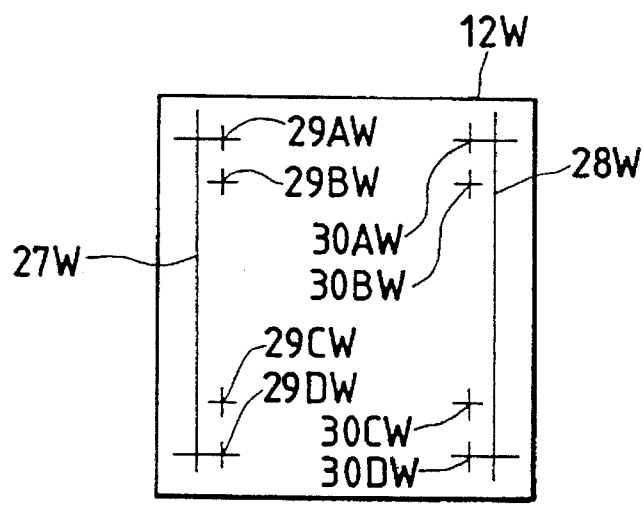
FIG. 4A is a projection view showing the mark arrangement on a reticle.

FIG. 4A shows a reticle image 12W obtained by projecting the reticle 12 shown in FIG. 2A onto the reference mark plate 6 shown in FIG. 3A. FIG. 4A illustrates mark images 29AW to 29DW conjugate with the fine alignment marks 29A to 29D in FIG. 2A, and mark images 30AW to 30DW conjugate with the fine alignment marks 30A to 30D. Furthermore, FIG. 4A illustrates mark images 27W and 28W conjugate with the curve measurement marks 27 and 28.

Figure 4B:
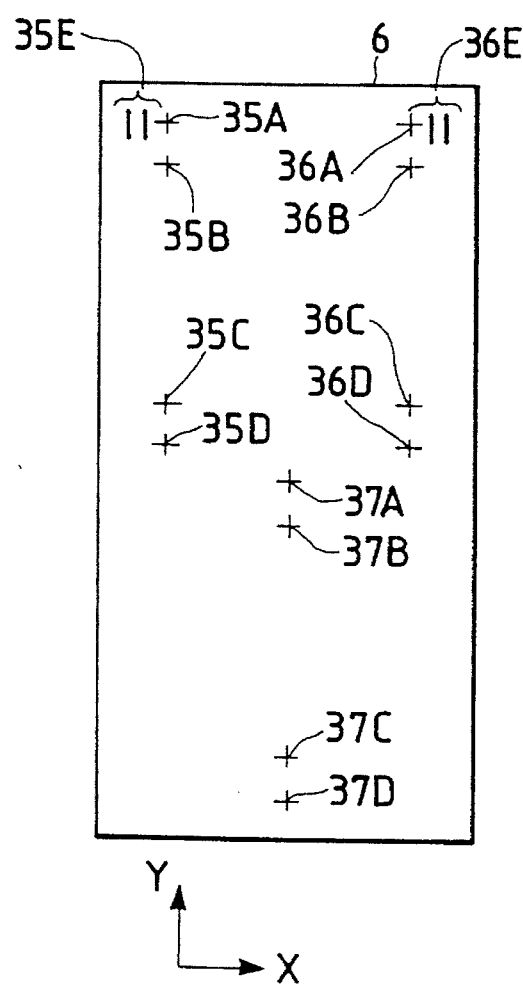
FIG. 4B is a plan view showing the arrangement of reference marks on a reference mark plate 6.
Figure 4C:
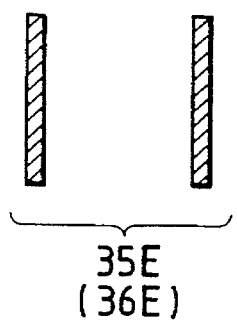
FIG. 4C is an enlarged view showing an example of a reference mark 35E (or 36E)

FIG. 4B shows the arrangement of reference marks on the reference mark plate 6. On the reference mark plate 6 in FIG. 4C, reference marks 35E and 36E are formed to be separated by the same interval, in the X direction, as that between the mark images 27W and 28W in FIG. 4A. The reference mark 35E is defined by two linear patterns of light-shielding portions arranged at a predetermined interval in the X direction, as shown in FIG. 4C, and the same applies to the reference mark 36E. These reference marks 35E and 36E are illuminated with illumination light of the same wavelength as that of the exposure light from the rear surface side.

Also, on the reference mark plate 6, reference marks 35A to 35D and 36A to 36D are formed to have substantially the same arrangement as that of the mark images 29AW to 29DW and 30AW to 30DW in FIG. 4A. These reference marks are illuminated with illumination light of the same wavelength as that of the exposure light from the rear surface of the reference mark plate 6. On the reference mark plate 6, a reference mark 37A is formed at a position separated by an interval IL in the Y direction as the scan direction from the middle point between the reference marks 35A and 36A. The interval IL is equal to a base line amount as an interval between the reference point in an image field of the projection optical system 8 and the reference point of the off-axis alignment device 34 in FIG. 1. Similarly, reference marks 37B, 37C, and 37D are respectively formed at positions separated by the interval IL in the Y direction from the middle point between the reference marks 35B and 36B, the middle point between the reference marks 35C and 36C, and the middle point between the reference marks 35D and 36D.

Then, the reticle 12 is finally aligned by measuring the positional relationship between the fine alignment marks 29A to 29D and the corresponding reference marks 35A to 35D using the RA microscope 19, and measuring the positional relationship between the fine alignment marks 30A to 30D and the corresponding reference marks 36A to 36D using the RA microscope 20.

Upon measurement of the curve of the movable mirror 21x, the positional shift amount between the reference mark 35E (or 36E) in FIG. 4B and the linear pattern 27c (or the linear pattern 28c) of the curve measurement mark 27 on the side of the reticle 12 in FIG. 2A is detected by the RA microscope 19 (or the RA microscope 20).

The arrangement of the RA microscope 19 and the like shown in FIG. 1 will be described in detail below for the purpose of explaining the method of obtaining the positional shift amount.

Figure 5:
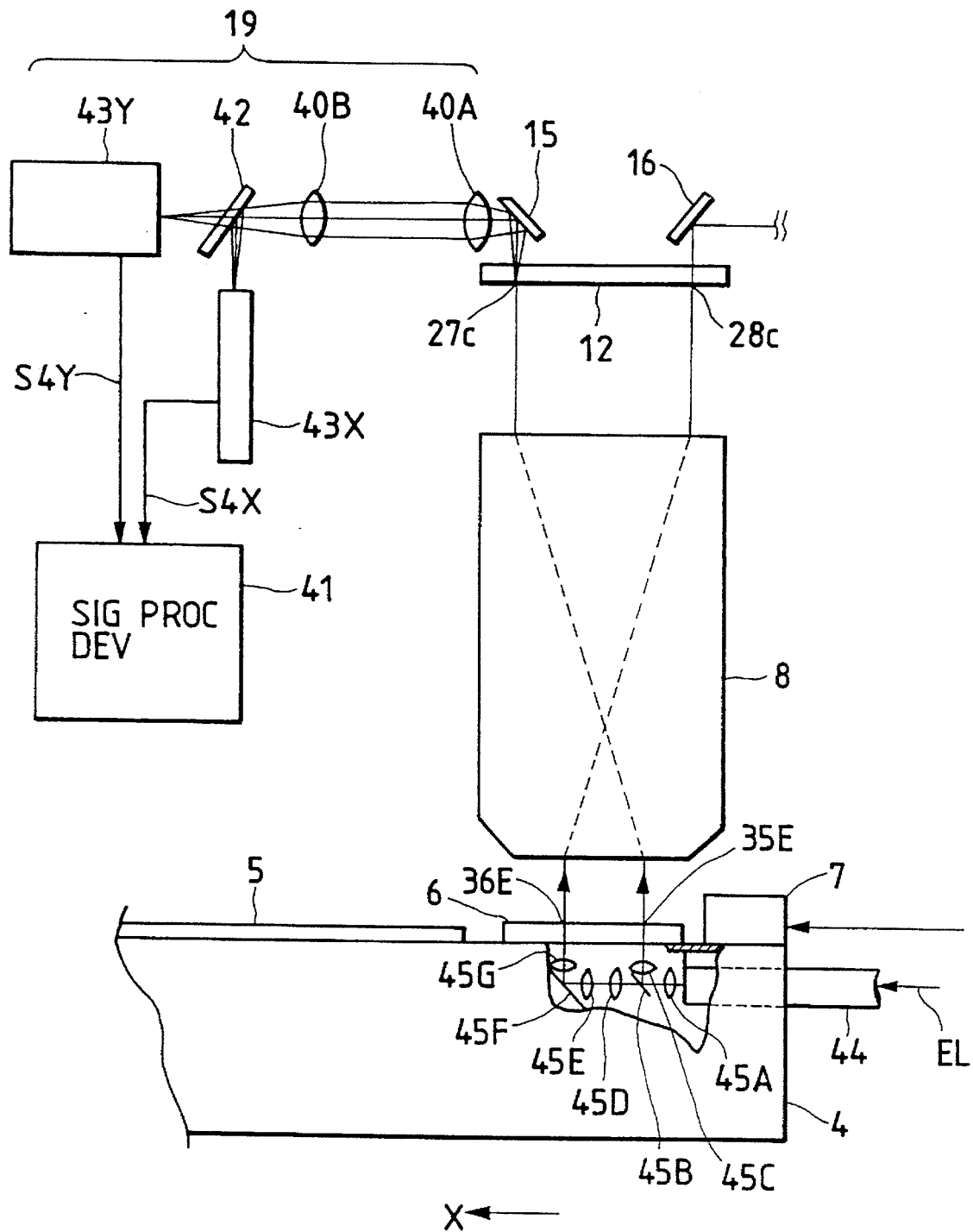
FIG. 5 is a partially cutaway schematic view showing the arrangement of a reticle alignment microscope 19 and an illumination system.

FIG. 5 shows the RA microscope 19 and its illumination system. Referring to FIG. 5, illumination light EL of the same wavelength as that of the exposure light is guided from a portion outside the Zθ-axis driving stage 4 to the interior of the Zθ-axis driving stage 4 via an optical fiber 44. In place of the optical fiber 44, the exposure light may be relayed by a lens system. The illumination light guided in this manner illuminates the reference marks 35A to 35D on the reference mark plate 6 via a lens 45A, a beam splitter 45B, and a lens 45C, and the illumination light transmitted through the beam splitter 45B illuminates the reference marks 36A to 36D on the reference mark plate 6 via lenses 45D and 45E, a mirror 45F, and a lens 45G. The illumination light can also illuminate the reference marks 35E and 36E.

Figure 6A:
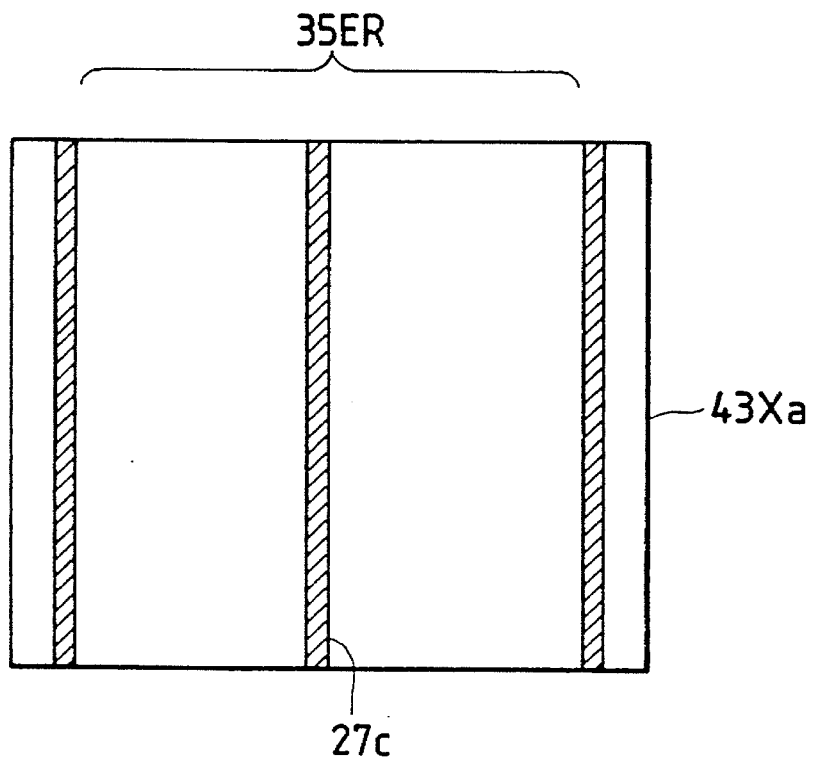
FIG. 6A is a view showing an image observed by an image pickup element shown in FIG. 5.

For example, light transmitted through the reference mark 35E forms an image of the reference mark 35E on the linear pattern 27c on the reticle 12 via the projection optical system 8. Light from the optical image of the reference mark 35E and the linear pattern 27c reaches a half mirror 42 via a deflection mirror 15, and lenses 40A and 40B. The light is split into two light beams by the half mirror 42, and the two light beams are respectively incident on the image pickup surfaces of x- and y-axis image pickup elements 43X and 43Y, each comprising a two-dimensional CCD. Of these image pickup elements, on an image pickup screen 43Xa of the image pickup element 43X, the image of the reference pattern 27c and an image 35ER of the reference mark 35E are projected, as shown in FIG. 6A. In this case, the direction of the horizontal scan line of the image pickup screen 43Xa of the x-axis image pickup element 43X corresponds to the x direction, and the direction of the horizontal scan line of the image pickup screen of the y-axis image pickup element 43Y corresponds to the y direction.

Figure 6B:
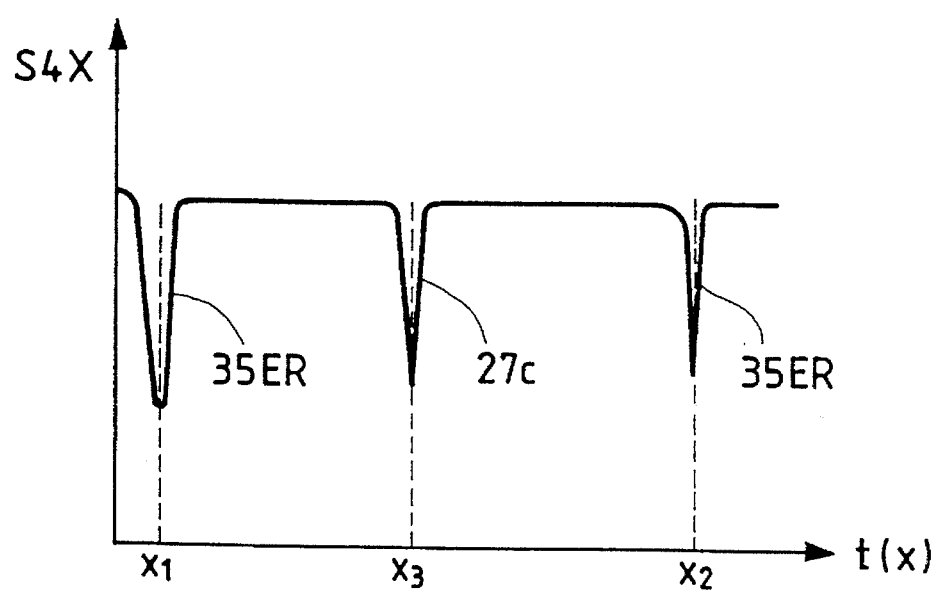
FIG. 6B is a waveform chart showing an image signal in the X direction corresponding to the image shown in FIG. 6A.

Therefore, the positional shift amount, in the x direction, between the image 35ER of the reference mark 35E and the linear pattern 27c can be calculated from an additive mean of an image pickup signal S4X from the image pickup element 43X. The image pickup signal S4X is supplied to a signal processing device 41. The image pickup signal S4X is detected to be a digital signal by analog/digital conversion in the signal processing device 41. Image data on respective scan lines are added and averaged on the. X-axis in the signal processing device 41, and the image signal S4X on the X-axis as the additive mean is as shown in FIG. 6B. These image data are respectively processed as one-dimensional image processing signals. On FIG. 6B, the abscissa of the image signal S4X corresponds to time t. However, when the width of the image pickup screen of the image pickup element 43X is measured in advance, the abscissa can be regarded to plot a position x.

When the signal obtained as described above is subjected to arithmetic processing in the signal processing device 41, a position $x_3$ in the x direction corresponding to the image of the linear pattern 27c of the reticle 12 in FIG. 6A, a position $x_1$ corresponding to the left pattern of the image 35ER of the reference mark 35E, and a position $x_2$ corresponding to the right pattern of the image 35ER can be obtained. A relative positional shift amount $\Delta x$, in the x direction, between the linear pattern 27c and the reference mark 35E is given by:

$$\Delta x = x_3 - (x_1 + x_2)/2 \qquad (1)$$

In this manner, the positional shift amount, in the x direction between the linear pattern 27c of the curve measurement mark 27 in FIG. 2A and the projected image of the reference mark 35E in FIG. 4B can be obtained. Similarly, the positional shift amount, in the x direction, between the linear pattern 28c of the curve measurement mark 28 in FIG. 2A and the projected image of the reference mark 36E in FIG. 4B can be obtained using the RA microscope 20.

Examples of a method of measuring the curved amount of the reflection surface of the movable mirror 21x on the reticle stage side in FIG. 3B using these positional shift amounts will be described below.

The first method of measuring the curve of the movable mirror 21x is a method executed with reference to the linear pattern 27c (or the linear pattern 28c) of the curve measurement mark 27 in FIG. 2A. More specifically, in this case, in a state wherein the image of the reference mark 35E and the linear pattern 27c are observed by the RA microscope 19 to monitor the positional shift amount $\Delta x$ in the x direction therebetween, as shown in FIG. 5, and in a state wherein the measurement value of the x-axis interferometer 14x on the reticle side in FIG. 3B is maintained to be a constant value, the reticle fine driving stage 11 is moved in the y direction as the scan direction. Then, positional shift amounts $\Delta x_i$, in the x direction, between the image of the reference mark 35E and the linear pattern 27c are calculated at a large number of measurement positions $y_i$ in the y direction.

Figure 7A:
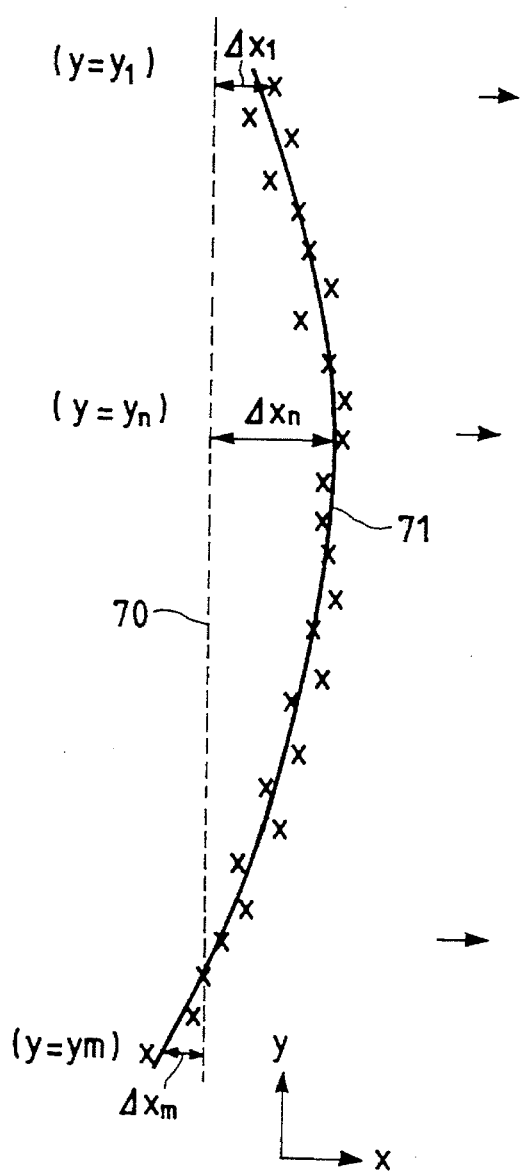
FIGS. 7A to 7D are waveform charts showing a curve which is obtained by approximating measurement values upon measurement of the curve of a movable mirror, and image signals corresponding to respective portions of the movable mirror.
Figure 7B:
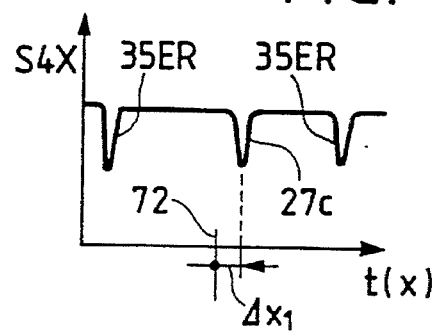
Figure 7C:
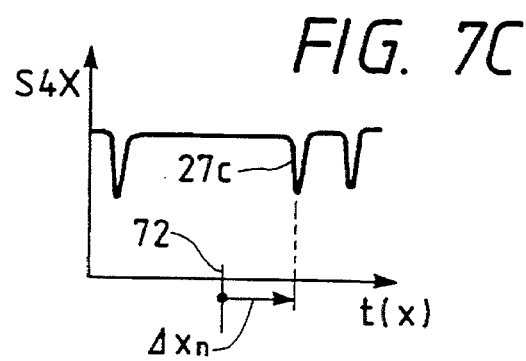
Figure 7D:
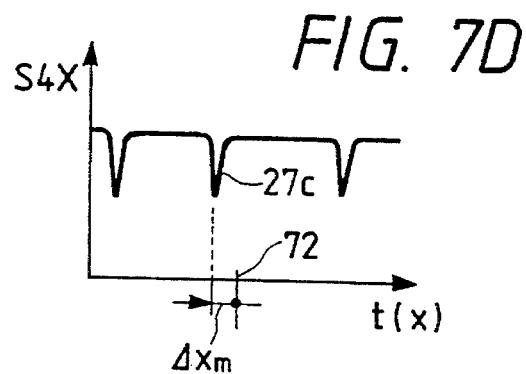

FIG. 7A shows the result of plotting the positional shift amounts $\Delta x_i$ at the measurement positions $y_i$, a line 70 is a straight line which extends straight in the y direction, and curve 71 is obtained by approximating a series of sampling points (points with marks x in FIG. 7A). In the measurement data as the basis of the curve 71, a positional shift amount $\Delta x_1$ from the straight line 70 is calculated to be the positional shift amount, in the x direction, between a middle point 72 of the image 35ER of the reference pattern 35E and the linear pattern 27c in the image pickup signal S4X, as shown in FIG. 7B. Similarly, positional shift amounts $\Delta x_n$ and $\Delta x_m$ are respectively calculated from image pickup signals shown in FIGS. 7C and 7D. FIGS. 7B to 7D show image pickup signals from the image pickup element 43X. The sampling interval in the y direction is determined by the curvature to be calculated, and the measurement accuracy of the RA microscope 19 as an alignment sensor.

The respective relative positional shift amounts $\Delta x_i$ are measured along the curve of the movable mirror 21x, as indicated by the marks x in FIG. 7A.

Upon calculation of the curve 71, filtering is executed in a software manner in accordance with a variation of the positional shift amounts $\Delta x_i$. A function corresponding to the calculated curve 71 is approximated by a quadratic curve as a function of the position y. For example, a coefficient A of the term of $y^2$ of the approximated function is calculated, and when the reticle fine driving stage 11 is scanned in the y direction in slit-scan exposure, the reticle fine driving state 11 is finely driven in the x direction in accordance with the position in the y direction so as to cancel the curve of the movable mirror 21x. In this manner, an intra-shot distortion of a pattern image exposed onto each shot area of the wafer 5 can be eliminated.

Referring to FIG. 7A, the curve 71 may be divided at proper intervals in the y direction, and the respective curve sections may be linearly approximated to obtain a coefficient B at each position y. Correction may then be performed on the basis of the coefficient B in the slit-scan exposure.

When image sampling is performed, in order to average reticle drawing errors, additive mean values in the vertical direction may be calculated for scan lines on the entire image pickup screen. Alternatively, sampling may be performed while scanning the reticle 12, and the sampled values may be averaged.

In the above-mentioned embodiment, the reticle fine driving stage 11 is scanned in the y direction while maintaining the measurement value, in the x direction, of the x-axis interferometer 14x to be a predetermined value. Conversely, the reticle fine driving stage 11 may be scanned in the y direction while the linear pattern 27c is set at the middle point of the image 35ER of the reference mark 35E in FIG. 6A. In this case, the positional shift amount $\Delta x$ measured by the RA microscope 19 is always 0, and the measurement value, in the x direction, of the x-axis interferometer 14x directly represents the curved amount of the movable mirror 21x.

In the projection exposure apparatus, when heat is accumulated due to exposure light radiated onto the pattern formation surface of the reticle 12 in exposure, and a temperature change of the reticle stage itself (the reticle fine driving stage 11) occurs, the curved state of the movable mirror 21x may change. However, a temperature sensor or the like may be arranged on the reticle stage to measure the relationship between the temperature change amount and the change in curved state in advance, and the correction coefficient may be varied in accordance with the measurement result, thereby canceling the change in curved state. Furthermore, after the curve correction of the movable mirror 21x, when another reticle is set and the same measurement is performed in the x- and y-axes, reticle drawing errors at the respective positions can be measured. Since the reticle drawing error between adjacent pattern portions is small, reticle drawing errors from a position near the curve measurement mark to the pattern portion are assumed to be almost the same and are grouped, and the error group may be corrected in slit-scan exposure, thus allowing reticle drawing error correction.

Figure 10A:
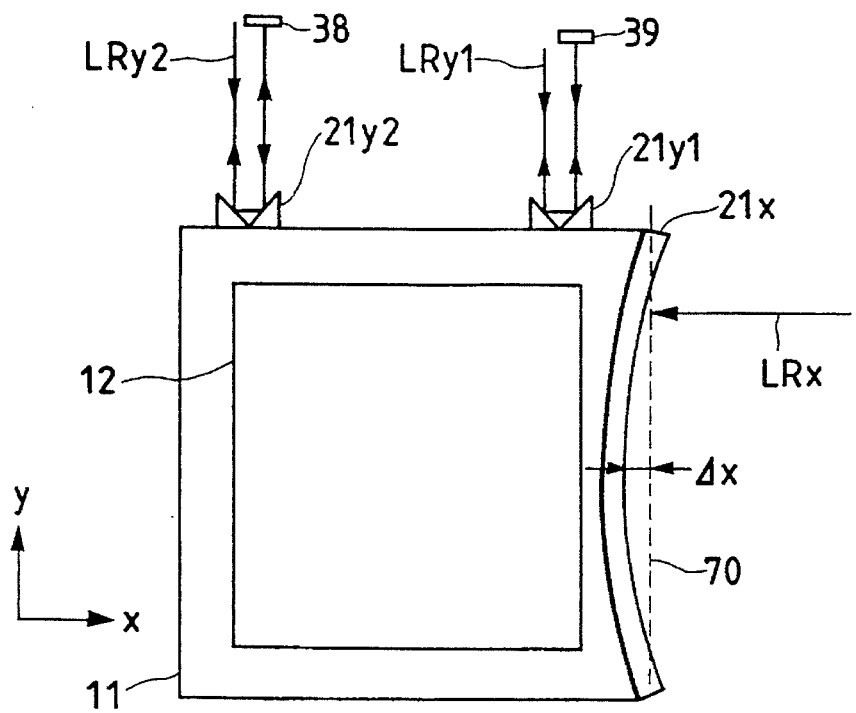
FIG. 10A is a plan view showing the curve of a movable mirror on the side of a reticle stage in a slit-scan exposure type projection exposure apparatus.

FIG. 10A shows a case wherein the movable mirror 21x on the reticle stage is curved. If the reflection surface of the movable mirror 21x is parallel to the straight line 70 which is perfectly parallel to the y-axis, the pattern on the reticle 12 can be exposed on the wafer without any distortion by scanning the reticle fine driving stage 11 in the y direction in a state wherein the x coordinate measured by the laser beam LRx is maintained to be a predetermined value.

Figure 10B:
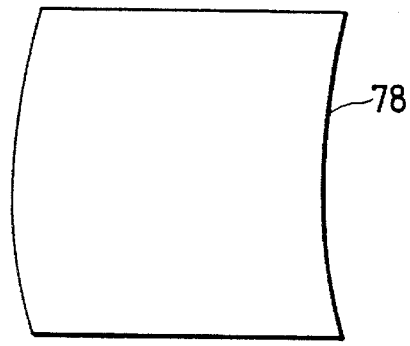
FIG. 10B is an enlarged view showing a distortion generated in a shot area formed on a wafer due to the curve of the movable mirror.
Figure 10C:
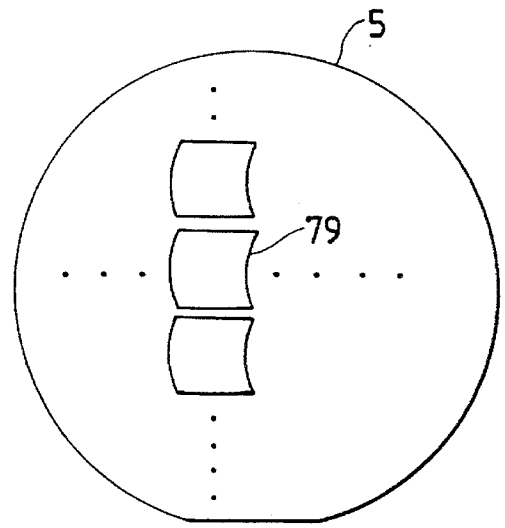
FIG. 10C is a plan view showing the arrangement of shot areas on the wafer.

However, when the reflection surface of the movable mirror 21x is curved to have a maximum shift amount $\Delta x$ in the x direction, as indicated by a solid curve in FIG. 10A, it is controlled to maintain the position, on the reflection surface, of the laser beam LRx from the interferometer to be the position of the straight line 70 indicated by a broken line upon scanning of the reticle 12. Therefore, the reticle fine driving stage 11 is driven along a curved path in a direction opposite to the curve of the movable mirror 21x. As a result, as shown in FIG. 10B, each shot area 78 on the wafer has an intra-shot distortion according to the curvature of the moving path of the reticle fine driving stage 11. As shown in FIG. 10C, the intra-shot distortion is common to all shot areas 79 on the wafer 5. In this case, if the characteristics of the intra-shot distortion vary among exposure apparatuses, such a variation results in a matching error between different layers on the wafer.

As described above, when the reticle fine driving stage 11 is scanned in the y direction in slit-scan exposure, the reticle fine driving stage 11 is finely driven in the x direction in accordance with the position in the y direction so as to cancel the curve of the movable mirror 21x. Thus, the intra-shot distortion of the pattern image exposed onto each shot area is eliminated, and a matching error between different layers on the wafer can also be eliminated.

Figure 8A:
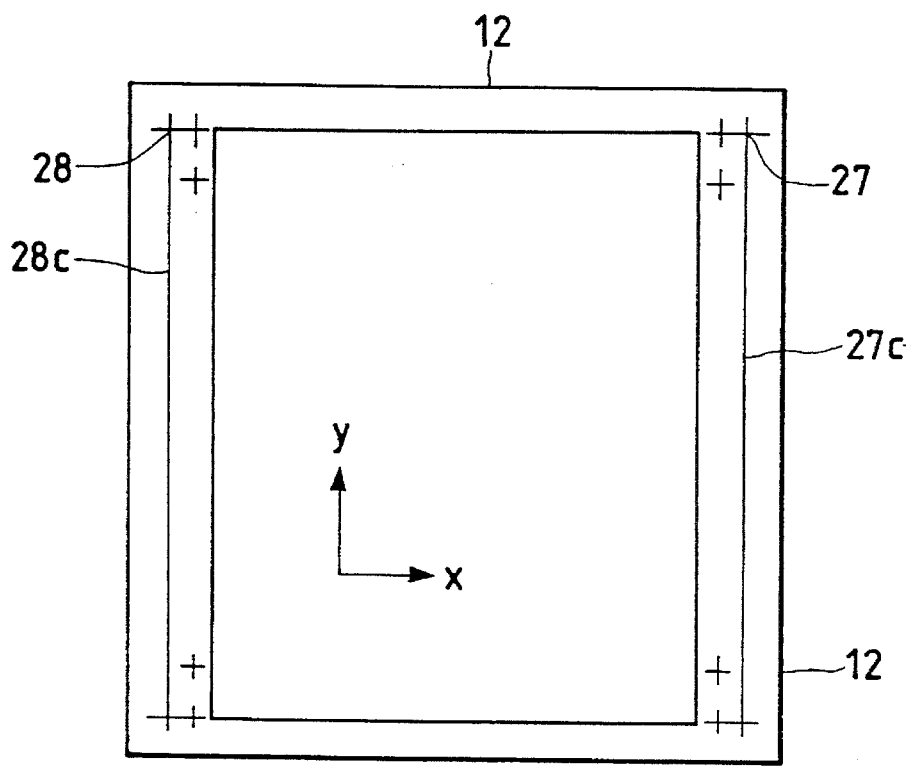
FIG. 8A is a plan view showing a reticle 12 of the embodiment.
Figure 8B:
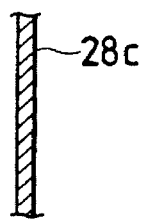
FIG. 8B is an enlarged view showing a linear pattern 28c of a curve measurement mark 28 in FIG. 8A.
Figure 8C:
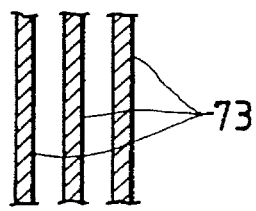
FIG. 8C is an enlarged view showing another example of the curve measurement mark.
Figure 8D:
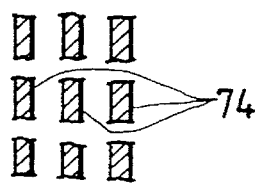
FIG. 8D is an enlarged view showing still another example of the curve measurement mark.

In the above-mentioned embodiment, the curve measurement marks 27 and 28 shown in FIG. 8A are used as curve measurement marks, and for example, the linear pattern 28c (see FIG. 8B) of the curve measurement mark 28 is used as a reference upon measurement of the curve of the movable mirror. However, as a reference used upon measurement of the curve of the movable mirror, a multi-pattern 73 which is defined by aligning linear patterns, extending in the y direction, in the x direction at a predetermined interval, as shown in FIG. 8C, may be used. When the multi-pattern 73 is used, and the measurement results of the linear patterns are averaged in the x direction, the curved amount of the movable mirror can be measured with higher accuracy. Also, as a reference used upon measurement of the curve of the movable mirror, a multi-line-and-space pattern 74, which is defined by aligning line-and-space patterns, formed at a predetermined pitch in the y direction, in the x direction at a predetermined interval, as shown in FIG. 8D, may be used. The multi-line-and-space pattern 74 can be easily formed on, e.g., a reticle by an electron beam drawing device or the like.

In the above-mentioned embodiment, the positional shift amounts of the linear patterns 27c and 28c are calculated with reference to the reference marks 35E and 36E formed on the reference mark plate 6 on the wafer side. Alternatively, these reference marks may be arranged in the RA microscope.

Figure 9:
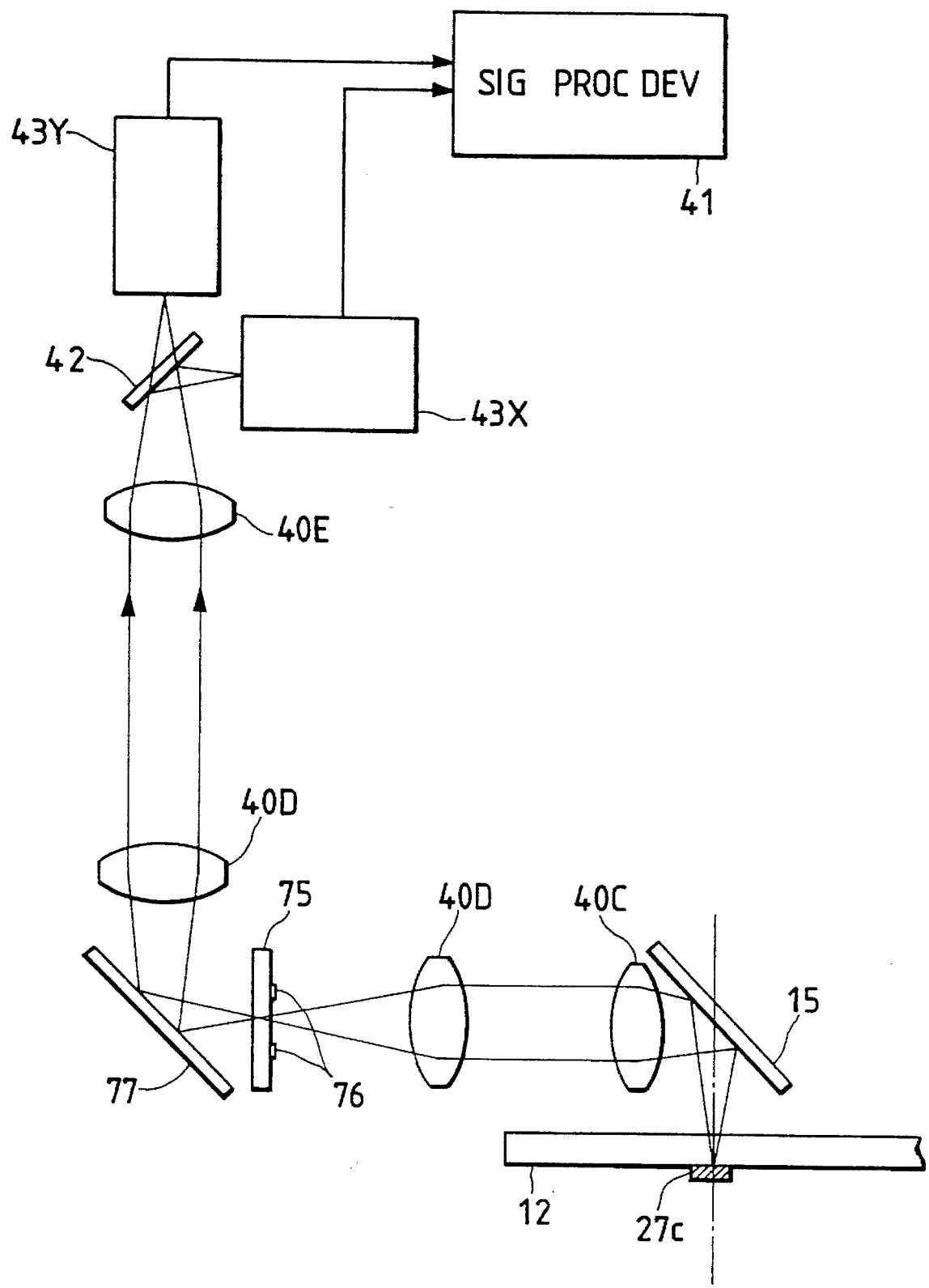
FIG. 9 is a schematic view showing another example of a reticle alignment microscope.

FIG. 9 shows an RA microscope which comprises internal reference marks. Referring to FIG. 9, illumination light from the linear pattern 27c on the reticle 12 is reflected by the half mirror 15, and forms an image of the linear pattern 27c on an index plate 75 via lenses 40C and 49D. An index mark 76 defined by linear patterns aligned at a predetermined interval in a direction conjugate with the x direction on the reticle 12 is formed on the index plate 75, and illumination light passing through the index plate 75 reaches the half mirror 42 via a mirror 77 and lenses 40D and 40E. The light is split into two light beams by the half mirror 42, and these two beams are respectively incident on the image pickup surfaces of the x- and y-axis image pickup elements 43X and 43Y. Other arrangements are the same as those in the RA microscope 19 shown in FIG. 5.

In the RA microscope shown in FIG. 9, the positional shift amount of the linear pattern 27c is detected with reference to the index mark 76. Therefore, upon measurement of the curve of the movable mirror 21x, the reference mark plate 6 on the wafer side need not be used.

In the above-mentioned embodiment, the curve measurement marks 27 and 28 are used. However, in FIG. 3B, if the straightness of the movement, in the y direction, of the reticle fine driving stage 11 is good, when the measurement values in the x direction are monitored by the x-axis interferometer 14x while the reticle fine driving stage 11 is simply scanned in the y direction, the measurement values directly represent the curved amount of the movable mirror 21x.

Next, a sequence from loading of the wafer 5 and the reticle 12 to the end of alignment in the projection exposure apparatus of this embodiment will be explained below. First, the reticle 12 is pre-aligned with reference to its outer shape on a reticle loader (to be described later).

Figure 11:
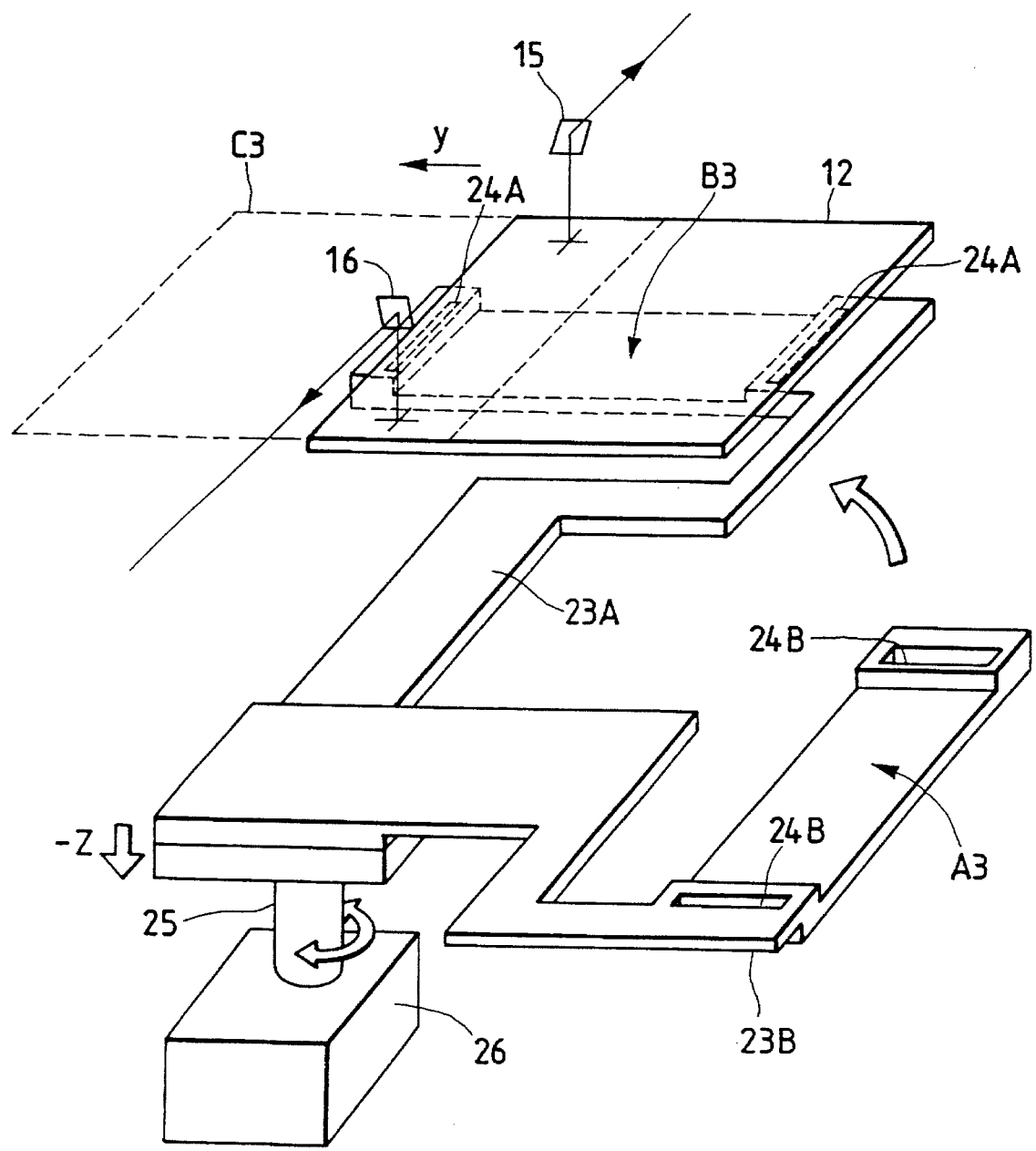
FIG. 11 is a perspective view showing a reticle loader system.

FIG. 11 shows a reticle loader system for loading the reticle 12 onto the reticle fine driving stage 11 shown in FIG. 1. The reticle loader shown in FIG. 11 is constituted by two reticle arms 23A and 23B, an arm rotation shaft 25 coupled to these reticle arms 23A and 23B, and a rotation mechanism 26 for rotating the arm rotation shaft 25. Vacuum chucking grooves 24A and 24B are respectively formed on the reticle placing surfaces of the reticle arms 23A and 23B, and the reticle arms 23A and 23B are supported to be independently rotatable via the arm rotation shaft 25.

Upon loading of the reticle 12, the reticle 12 is transferred from another reticle convey mechanism (not shown) onto the reticle arm 23A at a position A3. In this case, the other reticle arm 23B is used for unloading the reticle used in the previous process. Then, the reticle 12 is aligned to predetermined accuracy on the reticle arm 23A with reference to its outer shape by a reticle outer shape pre-alignment mechanism arranged near the position A3, and thereafter, the reticle 12 is vacuum-chucked on the reticle arm 23A. The reticle outer shape pre-alignment mechanism is disclosed in, e.g., FIG. 7 of U.S. Pat. No. 4,716,299, although not shown in FIG. 11. The rotation mechanism 26 rotates the reticle arm 23A via the arm rotation shaft 25 to convey the reticle 12 to a position B3 in the Y direction (in the direction of the reticle fine driving stage 11 in FIG. 1).

At this time, since the vacuum chucking groove 24A is located at a position in the direction perpendicular to the chucking position on the reticle fine driving stage 11 and outside the pattern area of the reticle 12, the reticle arm 23A can freely load/unload the reticle 12 onto the reticle fine driving stage 11 in a state wherein the reticle fine driving stage 11 is moved to a front portion in the y direction as the scan direction. When the reticle 12 has reached a position above the reticle fine driving stage 11 (see FIG. 1), the arm rotation shaft 25 is moved downward in the −Z direction. Then, the reticle 12 is placed on the vacuum chucking surface on the reticle fine driving stage 11, and the reticle arm 23A retreats after the end of transfer of the reticle 12. Thereafter, the reticle fine driving stage 11 conveys the reticle 12 in the direction of a position C3. In this case, the reticle arms 23A and 23B are independently driven to respectively perform, e.g., reticle loading and unloading operations at the same time, thus increasing the reticle exchange speed.

Then, alignment of the reticle 12 is performed, and a mechanism and operation therefor will be described below. As described above, rough alignment of the reticle 12 can be performed using the curve measurement marks 27 and 28. Thus, the rough alignment mechanism and operation using the curve measurement marks (rough search alignment marks) 27 and 28 will be described in detail below, partially repeating the above-mentioned description.

After the reticle 12 is placed on the reticle fine driving stage 11, the curve measurement mark (rough search alignment mark) 28 on the left side in FIG. 2A is detected by the RA microscope 20 in FIG. 1. FIG. 2B shows the observation areas 19R and 20R, on the reticle 12, of the RA microscopes 19 and 20 in this case. Upon execution of rough search of the reticle 12, the curve measurement marks (rough search alignment marks) 27 and 28 are respectively located outside the observation areas 19R and 20R and outside the area 33R conjugate with the effective exposure field. Although the curve measurement marks (rough search alignment marks) 27 and 28 must have a large size for rough search, if the size of the exposure field of the projection optical system is increased accordingly, this results in an increase in cost. Thus, a procedure upon execution of rough search in this embodiment will be described below with reference to FIGS. 12A and 12B.

Figure 12A:
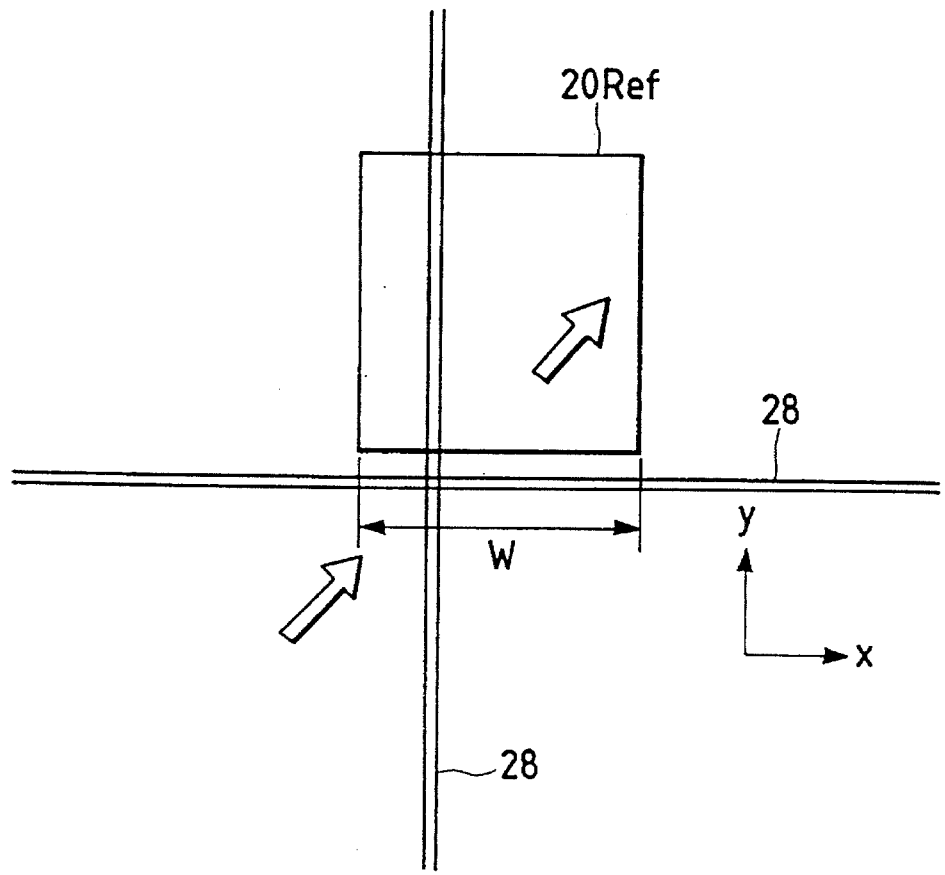
FIG. 12A is a plan view showing the arrangement of alignment marks on a reticle.
Figure 12B:
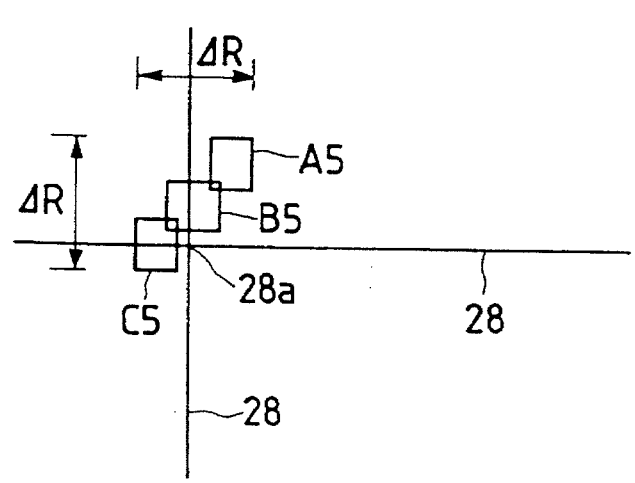
FIG. 12B is a plan view showing the arrangement of alignment marks and the like on an area conjugate with the effective field of a projection optical system.
Figure 12C:
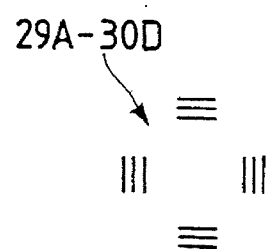
FIG. 12C is an enlarged view showing fine alignment marks 29A to 30A.

FIG. 12A is an enlarged view showing a portion near one cross pattern of the curve measurement mark (rough search alignment mark) 28, and FIG. 12B shows FIG. 12A in the reduced scale. Referring to FIGS. 12A and 12B, the widths, in the x and y directions, of a square effective field $20R_{ef}$ of the RA microscope 20 are represented by W, and the design value of a sum of a drawing error and a setting error of a pattern with respect to the outer shape of the reticle 12 is represented by ΔR. Therefore, as shown in FIG. 12B, a square area having the width ΔR always includes a crossing point 28a of one cross pattern of the curve measurement mark (rough search alignment mark) 28. An object to be detected is the x- and y-coordinates of the crossing point 28a of the cross pattern. In this embodiment, the reticle 12 is stepped via the reticle fine driving stage 11 in a direction that crosses, at 45°, the two straight lines passing the crossing point 28a of the curve measurement mark (alignment mark) 28, thereby scanning the effective field $20R_{ef}$ having the width W relative to a position near the crossing point 28a obliquely with respect to the x- and y-axes. Upon execution of the oblique scanning, the x- and y-coordinates of the crossing point 28a are obtained as those of the reticle fine driving stage 11 when the two straight lines passing the crossing point 28a cross a reference point in the effective field $20R_{ef}$.

For this purpose, if the integral part of a positive real number a is expressed by INT(a), the number of search frames as the minimum number of times of scanning the square area having the width ΔR with the effective field $20R_{ef}$ having the width W is given by {INT(ΔR/W)+1}. The number of search frames is calculated in advance. Then, {INT(ΔR/W)+1} effective fields AS, BS, C5, . . . each having the width W are set in a square area having the width ΔR and including the effective field B5 (FIG. 12B) at substantially the central position, so that the edge portions of the effective areas slightly overlap each other in the 45° direction with respect to the x- and y-axes. The reticle fine driving stage 11 (FIG. 1) is driven by the stepping method under the open-loop control, and an image in each effective field is sampled while setting each effective field in the effective field $20R_{ef}$ in FIG. 12A in turn.

As shown in FIG. 12B, the crossing point 28a of the curve measurement mark (alignment mark) 28 to be searched is present within at least a ΔR×ΔR wide search range, and the curve measurement mark (alignment mark) 28 is sufficiently larger than the search range. Therefore, as can be understood from the above description, when the effective field is stepped in the oblique direction with respect to the curve measurement mark (alignment mark) 28, the coordinates of the crossing point 28a of the curve measurement mark (alignment mark) 28 can be detected by the minimum number of frames. Image processing at that time can be one-dimensional image processing for an image signal obtained by adding all scan lines in the pickup frame.

Figure 13A:
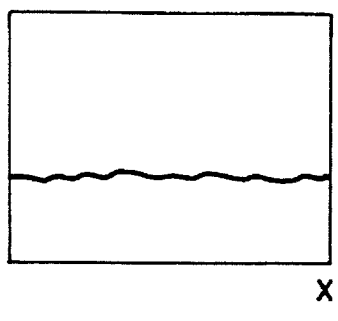
FIGS. 13A, 13B, 13C, 13D, 13E, and 13F are waveform charts showing various image pickup signals obtained from an image pickup element upon execution of rough alignment of a reticle.
Figure 13D:
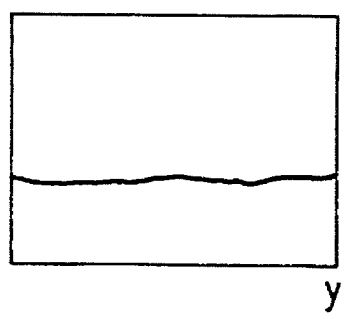
Figure 13B:
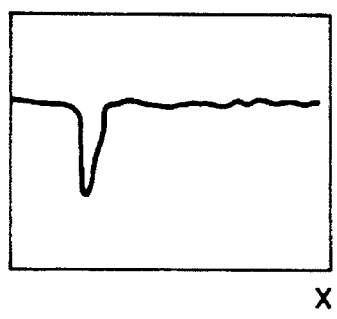
Figure 13E:
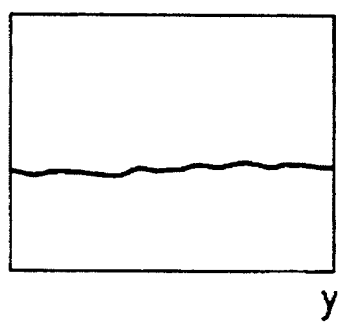
Figure 13C:
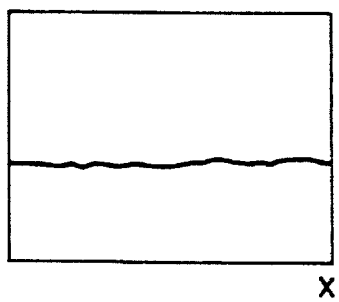
Figure 13C:
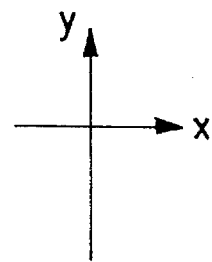
Figure 13F:
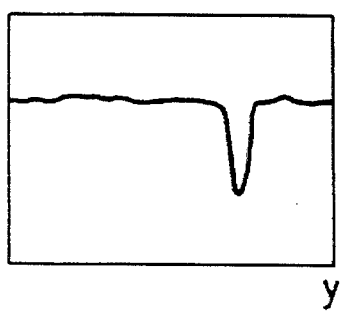
Figure 13F:
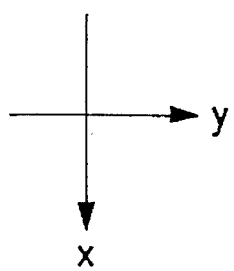

FIGS. 13A to 13F show various image signals obtained by adding all scan lines. FIGS. 13A and 13D show image signals along the x and y directions obtained in the effective field A5 in FIG. 12B, FIGS. 13B and 13E show image signals along the x and y directions obtained in the effective field B5 in FIG. 12B, and FIGS. 13C and 13F show image signals along the x and y directions obtained in the effective field C5 in FIG. 12B. The x-coordinate of the crossing point 28a is calculated from the image signal shown in FIG. 13B, and the y-coordinate of the crossing point 28a is calculated from the image signal shown in FIG. 13F. Similarly, the RA microscope 20 detects the x- and y-coordinates of a crossing point 28b of the other cross pattern of the curve measurement mark (alignment mark) 28 shown in FIG. 2A.

After the two-dimensional coordinate positions of the crossing points 28a and 28b of the cross patterns at the two ends of the curve measurement mark (alignment mark) 28 are detected, as described above, the curve measurement mark (alignment mark 27) is, in turn, moved to the observation area of the RA microscope 19, and the two-dimensional coordinate positions of the crossing points 27a and 27b of the cross patterns at the two ends of the curve measurement mark (alignment mark) 27 are similarly detected. In this case, a pattern-free portion of the reference mark plate 6 in FIG. 1 is moved into the exposure field of the projection optical system 8, and is illuminated from its bottom portion. In this manner, the curve measurement marks 27 and 28 are illuminated from their rear surface side with illumination light emerging from the reference mark plate 6.

In the above-mentioned sequence, the positional relationship of the curve measurement marks (alignment marks) 27 and 28 with respect to the observation areas 19R and 20R of the RA microscopes 19 and 20 in FIG. 2B, and a rough positional relationship of the curve measurement marks (alignment marks) 27 and 28 with respect to the reticle coordinate system can be obtained. A rough correspondence between the observation areas 19R and 20R of the RA microscopes and the wafer coordinate system can be attained by measuring the reference marks on the reference mark plate 6 (FIG. 1) using the RA microscopes 19 and 20. Thus, rough alignment that can avoid an overlap between the fine alignment marks 29A to 29D and 30A to 30D and the reference marks (35A to 35D and 36A to 36D) on the reference mark plate 6 in FIG. 4B is completed.

In this embodiment, in order to reduce the lens diameter of the projection optical system 8, alignment marks on the reticle 12 are classified into the curve measurement marks (alignment marks) and fine alignment marks. However, when the projection optical system 8 can have a large lens diameter, these curve measurement marks (alignment marks) and fine alignment marks can be common marks. In this case as well, the technique for searching the curve measurement marks (alignment marks) by stepping the stage in the oblique direction (FIGS. 12A and 12B) can be adopted, and the RA microscopes 19 and 20 can simultaneously search the curve measurement marks (alignment marks).

The allowable value of a rotational angle when the reticle 12 of this embodiment is placed on the reticle fine driving stage 11 will be examined below. For this purpose, the arrangement of an interferometer for measuring the coordinate, in the x direction, of the reticle fine driving stage 11 on which the reticle 12 is placed, as shown in FIG. 3B, will be partially described in detail below with reference to FIGS. 14A and 14B.

Figure 14A:
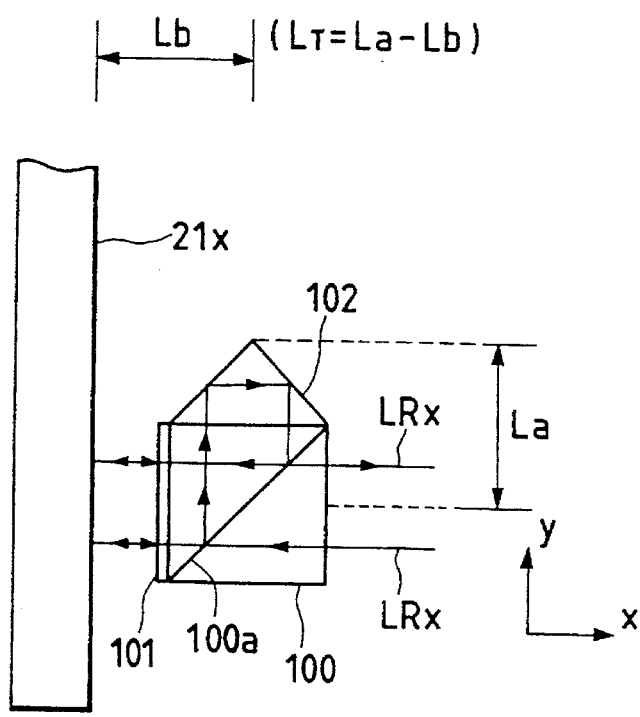
FIG. 14A is an optical path chart showing the state of a laser beam between an interferometer for the x-axis on the side of a reticle stage and a movable mirror 21x.

As shown in FIG. 14A, the x-axis interferometer (not shown in FIGS. 14A and 14B) radiates a laser beam LRx of p-polarized light onto a polarization beam splitter 100. The laser beam LRx is transmitted through a junction surface 100a of the polarization beam splitter 100a, passes through a quarterwave plate 101, and is then incident on the x-axis movable mirror 21x in a state of circularly polarized light. The laser beam LRx reflected by the movable mirror 21x is reflected by the junction surface 100a of the polarization beam.splitter 100 via a quarterwave plate 71 in a state of s-polarized light, and propagates toward a corner cube 102. The laser beam LRx reflected by the corner cube 102 is reflected by the junction surface 100a of the polarization beam splitter 100, and is incident on the movable mirror 21x in a state of circularly polarized light via the quarterwave plate 101.

Thereafter, the laser beam LRx reflected by the movable mirror 21x is incident on the junction surface 100a of the polarization beam splitter 100 in a state of p-polarized light via the quarterwave plate 71, and the laser beam LRx transmitted through the junction surface 100a is returned to a receiver of the x-axis interferometer (not shown). More specifically, when the movable mirror 21x is displaced by $\Delta x$ in the x direction, since the optical path length of the laser beam LRx changes by $4 \cdot \Delta x$, the x-axis interferometer on the reticle side also serves as a double-pass interferometer. In this case, if the interval, in the y direction, between the middle point in the y direction between the laser beam LRx emerging from the interferometer and the laser beam LRx returned to the interferometer, and the vertex of the corner cube 102 is represented by La, and the interval, in the x direction, from the movable mirror 21x to the vertex of the corner cube 102 is represented by Lb, a distance $L_T$ of the path of the laser beam LRx after the laser beam LRx is reflected by the movable mirror 21x until the laser beam LRx passes through the junction surface 100a of the polarization beam splitter is given by the following equation:

$$L_T = La + Lb \qquad (2)$$

Figure 14B:
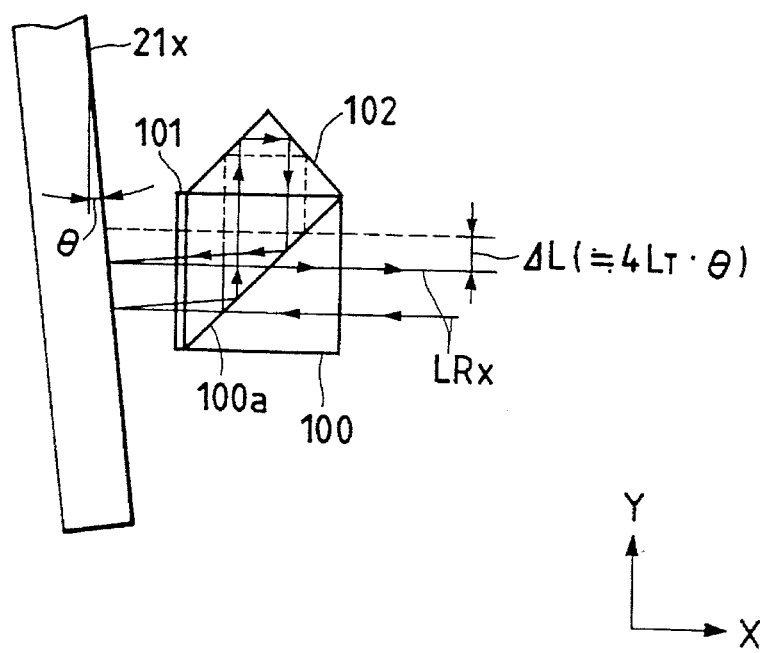
FIG. 14B is an optical path chart showing a case wherein the movable mirror 21X is rotated from the state shown in FIG. 14A.

In this case, as shown in FIG. 14B, when the reflection surface of the movable mirror 21x is largely rotated at an angle $\theta$ about an axis perpendicular to the plane of the drawing of FIG. 14B with respect to a plane perpendicular to the incident laser beam LRx, the position, in the y direction, of the laser beam LRx returned to the interferometer is laterally shifted by an interval $\Delta L$ from a case wherein the angle $\theta$ is 0. The interval $\Delta L$ can be expressed as follows using the above-mentioned distance $L_T$:

$$\Delta L = 4 \cdot L_T \cdot \theta \qquad (3)$$

Therefore, when the rotational angle $\theta$ of the movable mirror 21x exceeds an allowable value $\theta_1$, the lateral shift amount $\Delta L$ of the laser beam LRx incident on the receiver of the interferometer exceeds a predetermined allowable amount. Thus, a reference beam and the laser beam LRx for length measurement can no longer sufficiently overlap each other, resulting in a length measurement error of the interferometer. In this case, the allowable value $\theta_1$ of the rotational angle which does not cause an interferometer error is calculated in advance, and the rotation error of the reticle 12 must be controlled not to exceed the calculated allowable value $\theta_1$ upon execution of rough alignment of the reticle 12. The movable mirror 21x is rotated when the pattern drawing area on the reticle 12 has been rotated with respect to the reticle coordinate system defined by the measurement value of the interferometer on the reticle side and when the reticle fine driving stage 11 is rotated in a direction to cancel the rotational angle of the pattern drawing area. Therefore, in order to control the rotational angle $\theta$ of the movable mirror 21x to be equal to or smaller than the allowable value $\theta_1$, the rotational angle of the pattern drawing area on the reticle 12 must be controlled to be equal to or smaller than the allowable value $\theta_1$ upon execution of rough alignment of the reticle 12.

In this embodiment, when the reticle 12 is placed on the reticle fine driving stage 11, the rotational angle of the pattern drawing area on the reticle 12 is controlled to be equal to or smaller than the allowable value $\theta_1$. The technique for attaining this control will be described below with reference to FIGS. 15A, 15B, 15C, 15D, and 15E.

As shown in FIG. 15A, in an initial state of reticle loading, the reticle 12 is aligned with reference to its outer shape, and is vacuum-chucked on the reticle arm 23A. For the sake of descriptive convenience, a pattern drawing area PA is largely inclined with respect to the outer shape of the reticle 12. In this case, the x-axis is assumed in a direction parallel to the laser beam LRx in FIG. 3B, the y-axis is assumed in a direction parallel to the laser beams LRy1 and LRy2, and the reticle coordinate system is formed by these x- and y-axes. The inclination of the drawing area PA is expressed by the crossing angle between a straight line passing the two crossing points 27a and 27b at the two ends of one curve measurement mark (rough search alignment mark) 27 (or a straight line passing the two crossing points 28a and 28b at the two ends of the other curve measurement mark (rough search alignment mark) 28), and the y-axis of the reticle coordinate system. In this initial state, an $x_{RS}$-axis and a $y_{RS}$-axis are assumed on the reticle fine driving stage 11 to be parallel to the x- and y-axes, respectively.

Subsequently, as shown in FIG. 15B, after the reticle 12 is placed on the reticle fine driving stage 11 by the reticle arm 23A, the reticle arm 23A is escaped to the position B3. In this state, the above-mentioned rough alignment is executed for the alignment marks 27 and 28, and a rotation angle (rotation error) $\phi$ of the drawing area PA on the reticle 12 with respect to the y-axis of the reticle coordinate system is measured. The rotational angle $\phi_1$ is obtained to be, e.g., an angle defined between a straight line connecting the crossing points 27a and 27b at the two ends of the alignment mark 27, and the y-axis. For the purpose of descriptive convenience, assume that the drawing area PA is rotated clockwise with respect to the y-axis.

When the rotational angle $\phi_1$ exceeds the allowable value $\theta_1$, the reticle 12 is temporarily detached from the reticle fine driving stage 11 using the reticle arm 23A, as shown in FIG. 15C. Then, the reticle fine driving stage 11 is rotated by a mechanical limit angle $\phi_2$ of the rotational angle in the direction of the rotational angle $\phi_1$. More specifically, the $y_{RS}$-axis on the reticle fine driving stage 11 is rotated clockwise by the limit angle $\phi_2$ with respect to the y-axis. Thereafter, as shown in FIG. 15D, the reticle 12 is attached on the reticle fine driving stage 11 again using the reticle arm 23A. The reticle fine driving stage 11 is then rotated counterclockwise by the limit angle $\phi_2$ with respect to the y-axis, and is restored to the original position. Thus, as shown in FIG. 15E, the angle of the drawing area PA of the reticle 12 with respect to the y-axis of the reticle coordinate system becomes smaller than the allowable value $\theta_1$.

When the angle of the drawing area PA of the reticle 12 with respect to the y-axis of the reticle coordinate system exceeds the allowable value $\theta_1$ even in the state shown in FIG. 15E, the operations shown in FIGS. 15C to 15E can be repeated again. By the operation for rotating the reticle fine driving stage 11 by one revolution, the rotation error of even a reticle which has a rotation error twice the allowable value $\theta_1$ can be suppressed to be equal to or smaller than the allowable value $\theta_1$. Furthermore, when the operation for rotating the reticle fine driving stage 11, and restoring the stage 11 to an original position is repeated n times (n is an integer equal to or larger than 2), the rotation error of the drawing area PA on the reticle 12 can be suppressed to be equal to or smaller than the allowable value $\theta_1$ regardless of the magnitude of the rotation error in the initial state of the reticle 12. Thereafter, the above-mentioned fine alignment is executed, thus completing the alignment of the reticle 12.

When the rotational angle $\phi_1$ of the drawing area PA on the reticle 12 satisfies $\theta_1 < \phi_1 \leq \phi_2$, the reticle fine driving stage 11 may be rotated by the rotational angle $\phi_1$ of the drawing area PA in place of being rotated by the mechanical limit angle $\phi_2$.

As described above, in this embodiment, since the positions of reticle marks are detected using the image processing system while stepping the reticle 12 in an oblique direction, measurement upon execution of rough alignment of a reticle in the slit-scan exposure type projection exposure apparatus can be realized. Furthermore, in this embodiment, the image processing system for fine alignment is also used for rough alignment, and a servo control system required in a synchronous detection type alignment system like that described in U.S. Pat. No. 4,710,029 is omitted. Thus, the arrangement is simplified, and the manufacturing cost can be reduced. When the rotational angle of the drawing area on the reticle 12 exceeds an allowable value, the reticle 12 is detached from the reticle fine driving stage 11, and after the reticle fine driving stage 11 is rotated, the reticle 12 is attached again. Since this sequence is adopted, a failure in reticle alignment can be avoided.

In the above-mentioned embodiment, as shown in FIGS. 15B and 15C, after the reticle 12 is detached from the reticle fine driving stage 11, the reticle fine driving stage 11 is rotated by the rotational angle $\phi_2$. Alternatively, after the reticle fine driving stage 11 is rotated in advance by $-\phi_2$, the reticle 12 may be detached. In this case, as an operation corresponding to FIGS. 15D and 15E, after the reticle fine driving stage 11 is rotated by the rotational angle $\phi_2$ to restore an original state, the reticle 12 is attached again onto the reticle fine driving stage 11. With this method as well, the rotational angle of the drawing area on the reticle 12 can be controlled to be equal to or smaller than the allowable value.

In the above-mentioned embodiment, as shown in FIGS. 15A to 15E, when the rotational angle of the pattern drawing area PA on the reticle 12 with respect to the reticle coordinate system exceeds the allowable value, the reticle fine driving stage 11 is rotated. Alternatively, the reticle 12 may be rotated in a direction opposite to the rotational angle by the reticle arm 23A side from which the reticle 12 is detached. For this purpose, a rotation mechanism for rotating the reticle 12 on the reticle arm 23A may be added.

Also, for a reticle having a reticle drawing error of the same tendency with respect to the outer shape reference, a rotation error caused by the reticle drawing error may be stored, and the reticle fine driving stage 11 may be driven in the direction of an axis defined by the rotation error. Thus, the reticle need not be re-placed on the reticle fine driving stage 11. Furthermore, a tracking error caused by shifting the movable mirror 21x in a non-scan direction in slit-scan exposure due to the rotation error can be decreased.

As described above, the present invention is not limited to the above-mentioned embodiment, and may adopt various arrangements within the spirit and scope of the invention.

What is claimed is:

1. A method of driving a mask stage using an exposure device having said mask stage which mounts a mask formed with a predetermined pattern and is movable in a predetermined scan direction, a movable mirror which is arranged on said mask stage and has a reflection surface substantially parallel to the scan direction, measurement means for measuring a coordinate position, in a direction perpendicular to the scan direction, of said mask stage by radiating a measurement beam onto said movable mirror, a substrate stage which mounts a photosensitive substrate and is movable in a direction substantially parallel to the scan direction, an illumination system for illuminating a predetermined area on the mask with illumination light, and a projection optical system for projecting the pattern on the mask onto the photosensitive substrate, said exposure device for sequentially exposing the pattern on the mask onto the photosensitive substrate while synchronously scanning said mask stage and said substrate stage in the scan direction with respect to an optical axis of said projection optical system, comprising the steps of:

the first step of placing the mask on said mask stage;

the second step of calculating a curved amount of said movable mirror by measuring the coordinate position, in the direction perpendicular to the scan direction, of said mask stage by said measurement means while scanning said mask stage in the scan direction; and the third step of moving said mask stage in the direction perpendicular to the scan direction to correct the curved amount of said movable mirror calculated in the second step when said mask stage is scanned in the scan direction with respect to the optical axis;

wherein the mask has a measurement mark, and the second step includes the step of calculating the curved amount of said movable mirror with reference to the measurement mark.

2. A method of driving a mask stage using an exposure device having said mask stage which mounts a mask formed with a predetermined pattern and is movable in a predetermined scan direction, a movable mirror which is arranged on said mask stage and has a reflection surface substantially parallel to the scan direction, measurement means for measuring a coordinate position, in a direction perpendicular to the scan direction, of said mask stage by radiating a measurement beam onto said movable mirror, a substrate stage which mounts a photosensitive substrate and is movable in a direction substantially parallel to the scan direction, an illumination system for illuminating a predetermined area on the mask with illumination light, and a projection optical system for projecting the pattern on the mask onto the photosensitive substrate, said exposure device for sequentially exposing the pattern on the mask onto the photosensitive substrate while synchronously scanning said mask stage and said substrate stage in the scan direction with respect to an optical axis of said projection optical system, comprising the steps of:

the first step of placing the mask on said mask stage;

the second step of calculating a curved amount of said movable mirror by measuring the coordinate position, in the direction perpendicular to the scan direction, of said mask stage by said measurement means while scanning said mask stage in the scan direction; and the third step of moving said mask stage in the direction perpendicular to the scan direction to correct the curved amount of said movable mirror calculated in the second step when said mask stage is scanned in the scan direction with respect to the optical axis;

wherein the mask has a measurement mark, and the second step includes the step of scanning said mask stage while the measurement mark is aligned to a reference position, and calculating the curved amount of said movable mirror on the basis of the coordinate position, in the direction perpendicular to the scan direction, of said mask stage measured by said measurement means.

3. A method of aligning a mask with respect to a coordinate system on the side of a mask stage as pre-processing for exposing a pattern on the mask onto a photosensitive substrate using an exposure device having said mask stage which mounts the mask formed with a predetermined pattern and is movable in a predetermined scan direction, a substrate stage which mounts the photosensitive substrate and is movable in a direction substantially parallel to the scan direction, an illumination system for illuminating a predetermined illumination area on the mask with illumination light, a projection optical system for projecting the pattern on the mask onto the photosensitive substrate, and observation means for observing a mark on the mask, the exposure device for sequentially exposing the pattern on the mask onto the photosensitive substrate while synchronously scanning said mask stage and said substrate stage in the scan direction with respect to an optical axis of said projection optical system, comprising:

the first step of placing, as the mask, a mask formed with a first alignment mark having two linear patterns which cross each other, on said mask stage;

the second step of moving the two linear patterns in a direction to cross each other on the first alignment mark on the mask relative to an observation area of said observation means;

the third step of calculating a coordinate position, in the coordinate system on the side of said mask stage, of a crossing point of the two linear patterns of the first alignment mark by processing image data obtained by said observation means; and the fourth step of aligning the mask to the coordinate system on the side of said mask stage on the basis of the coordinate position of the crossing point of the two linear patterns of the first alignment mark.

4. A method according to claim 3, wherein the mask has a second alignment mark having two linear patterns which cross each other, at a position different from the first alignment mark;

said method further comprises:

the fifth step of moving the two linear patterns in a direction to cross each other on the second alignment mark on the mask relative to an observation area of said observation means, and the sixth step of calculating a coordinate position, in the coordinate system on the side of said mask stage, of a crossing point of the two linear patterns of the second alignment mark by processing image data obtained by said observation means; and the fifth step comprises the step of aligning the mask to the coordinate system on the side of said mask stage on the basis of the coordinate position of the crossing point of the two linear patterns of the first alignment mark and the coordinate position of the crossing point of the two linear patterns of the second alignment mark.

5. A method of aligning a mask with respect to a coordinate system on the side of a mask stage as pre-processing for exposing a pattern on the mask onto a photosensitive substrate using an exposure device having said mask stage which mounts the mask formed with a predetermined pattern and is movable in a predetermined scan direction, a substrate stage which mounts the photosensitive substrate and is movable in a direction substantially parallel to the scan direction, an illumination system for illuminating a predetermined illumination area on the mask with illumination light, and a projection optical system for projecting the pattern on the mask onto the photosensitive substrate, said exposure device for sequentially exposing the pattern on the mask onto the photosensitive substrate while synchronously scanning said mask stage and said substrate stage in the scan direction with respect to an optical axis of said projection optical system, comprising:

the first step of placing, as the mask, a mask formed with an alignment mark, on said mask stage; and the second step of calculating a rotational angle of the mask with respect to the coordinate system on the side of said mask stage by calculating a coordinate position of said alignment mark, and when the rotational angle calculated in the second step exceeds a predetermined allowable value, said method further comprising:

the third step of unloading the mask from said mask stage;

the fourth step of rotating said mask stage by a predetermined rotational angle in a direction of the rotational angle calculated in the second step; and the fifth stage of placing the mask on said mask stage again, and rotating said mask stage in a direction opposite to the rotational direction in the fourth step.

6. A method of aligning a mask with respect to a coordinate system on the side of a mask stage as pre-processing for exposing a pattern on the mask onto a photosensitive substrate using an exposure device having said mask stage which mounts the mask formed with a predetermined pattern and is movable in a predetermined scan direction, a substrate stage which mounts the photosensitive substrate and is movable in a direction substantially parallel to the scan direction, an illumination system for illuminating a predetermined illumination area on the mask with illumination light, and a projection optical system for projecting the pattern on the mask onto the photosensitive substrate, said exposure device for sequentially exposing the pattern on the mask onto the photosensitive substrate while synchronously scanning said mask stage and said substrate stage in the scan direction with respect to an optical axis of said projection optical system, comprising:

the first step of placing, as the mask, a mask formed with an alignment mark, on said mask stage; and the second step of calculating a rotational angle of the mask with respect to the coordinate system on the side of said mask stage by calculating a coordinate position of said alignment mark, and when the rotational angle calculated in the second step exceeds a predetermined allowable value, said method further comprising:

the third step of rotating said mask stage in a direction opposite to the rotational angle calculated in the second step;

the fourth step of unloading the mask from said mask stage; and the fifth step of rotating said mask stage in a direction opposite to the rotational direction in the third step, and placing the mask on said mask stage again.

7. A method of driving a mask when a mask stage carrying a mask having a predetermined pattern and a mark for a measurement and a substrate stage carrying a substrate are synchronously moved, comprising the steps of:

measuring a positional deviation of said mask stage along a direction perpendicular to a movement direction, by moving said mask stage along the movement direction while measuring a position of said mask stage along the direction substantially perpendicular to a movement direction and a position of said mark relating to a direction substantially perpendicular to the movement direction; and correcting the positional deviation when said mask stage and said substrate stage are synchronously moved, based on said measuring of positional deviation of said mask stage, including said measuring of said position of said mask stage and said measuring of said position of said mark.

8. A method according to claim 7, wherein said mark is elongated along the movement direction.

9. An exposing apparatus synchronously moving a mask stage carrying a mask having a predetermined pattern and a mark for a measurement and a substrate stage carrying a substrate, to form the pattern image onto said substrate, comprising:

a position measuring system for measuring a position of said mask stage along a direction substantially perpendicular to a movement direction;

a mark detecting system for measuring a position of said mark; and a control system for obtaining a positional deviation of said mask stage along the direction substantially perpendicular to the movement direction based on the result of the measurement of said mark detecting system, and for correcting the positional deviation, and for synchronously moving said mask stage and said substrate stage.

* * * * *